(12) United States Patent
Hseih et al.

(10) Patent No.: US 11,561,085 B2
(45) Date of Patent: Jan. 24, 2023

(54) RESOLVING MULTIPATH INTERFERENCE USING A MIXED ACTIVE DEPTH SYSTEM

(71) Applicant: QUALCOMM Incorporated, San Diego, CA (US)

(72) Inventors: Biay-Cheng Hseih, Irvine, CA (US); Jian Ma, San Diego, CA (US); Sergiu Radu Goma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 568 days.

(21) Appl. No.: 16/682,530

(22) Filed: Nov. 13, 2019

(65) Prior Publication Data

US 2020/0386540 A1 Dec. 10, 2020

Related U.S. Application Data

(60) Provisional application No. 62/857,804, filed on Jun. 5, 2019.

(51) Int. Cl.
*G01B 11/22* (2006.01)
*G01S 7/491* (2020.01)
(Continued)

(52) U.S. Cl.
CPC ............ *G01B 11/22* (2013.01); *G01S 7/4915* (2013.01); *G02B 27/425* (2013.01); *G06T 7/521* (2017.01);
(Continued)

(58) Field of Classification Search
None
See application file for complete search history.

(56) References Cited

U.S. PATENT DOCUMENTS 10,044,985 B1 8/2018 Parker
2009/0086081 A1 4/2009 Tan et al.
(Continued)

FOREIGN PATENT DOCUMENTS

WO 2016076796 A1 5/2016
WO 2018217367 A1 11/2018

OTHER PUBLICATIONS

Cheng et al., "Proposal and demonstration of germanium-on-silicon lock-in pixels for indirect time-of-flight based three-dimensional sensing,"—Arvix.org (Year: 2018).*
(Continued)

*Primary Examiner* — Edemio Navas, Jr.
(74) *Attorney, Agent, or Firm* — Polsinelli

(57) ABSTRACT

Aspects of the present disclosure relate to depth sensing using a device. An example device includes a light projector configured to project light in a first and a second distribution. The first and the second distribution include a flood projection when the device operates in a first mode and a pattern projection when the device operates in a second mode, respectively. The example device includes a receiver configured to detect reflections of light projected by the light projector. The example device includes a processor connected to a memory storing instructions. The processor is configured to determine first depth information based on reflections detected by the receiver when the device operates in the first mode, determine second depth information based on reflections detected by the receiver when the device operates in the second mode, and resolve multipath interference (MPI) using the first depth information and the second depth information.

26 Claims, 22 Drawing Sheets

(51) Int. Cl.
  *G02B 27/42*    (2006.01)
  *G06T 7/521*    (2017.01)
  *H01L 27/146*   (2006.01)
  *G01S 7/4915*   (2020.01)

(52) U.S. Cl.
  CPC .......... *H01L 27/14643* (2013.01); *G06T 2207/10028* (2013.01)

(56) References Cited

U.S. PATENT DOCUMENTS

| | | | |
|---|---|---|---|
| 2011/0284727 A1* | 11/2011 | Konishi | H04N 5/3765 250/214 P |
| 2014/0118257 A1* | 5/2014 | Baldwin | G06F 3/038 345/158 |
| 2017/0131568 A1* | 5/2017 | Haddock | G02C 7/083 |
| 2017/0329012 A1* | 11/2017 | Büttgen | G01B 11/25 |
| 2018/0035887 A1 | 2/2018 | Nakanishi et al. | |
| 2018/0124372 A1* | 5/2018 | Yang | H04N 13/239 |
| 2018/0341008 A1* | 11/2018 | Ortiz Egea | G01S 7/4816 |
| 2019/0018137 A1* | 1/2019 | Akkaya | G02B 27/4272 |
| 2019/0369247 A1 | 12/2019 | Lindner et al. | |
| 2020/0025924 A1 | 1/2020 | Aotake et al. | |
| 2021/0321021 A1 | 10/2021 | Ma et al. | |

OTHER PUBLICATIONS

Co-Pending U.S. Appl. No. 15/968,317, filed May 1, 2018.
International Search Report and Written Opinion—PCT/US2020/025268—ISA/EPO—dated Jul. 22, 2020.

* cited by examiner

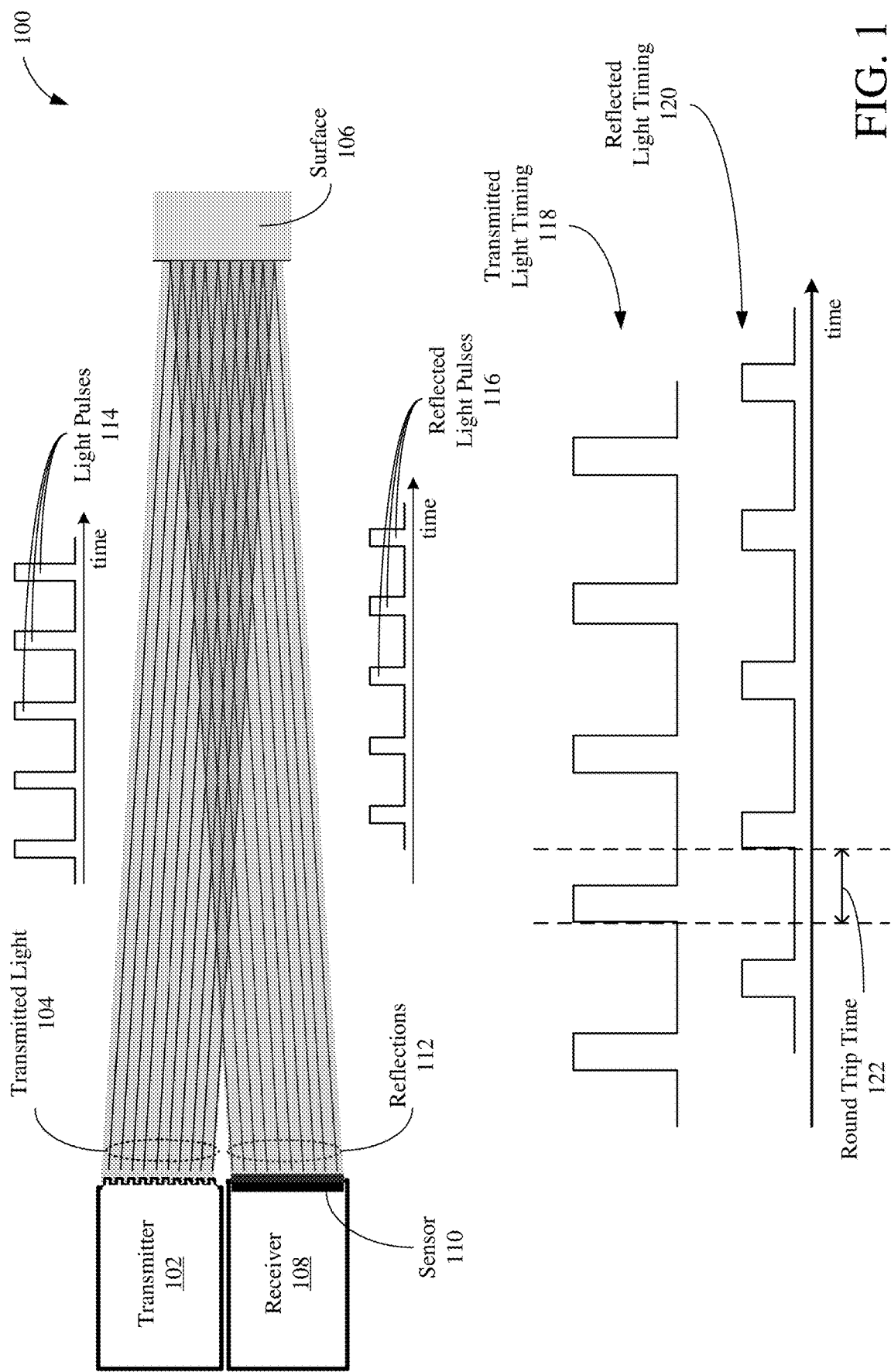

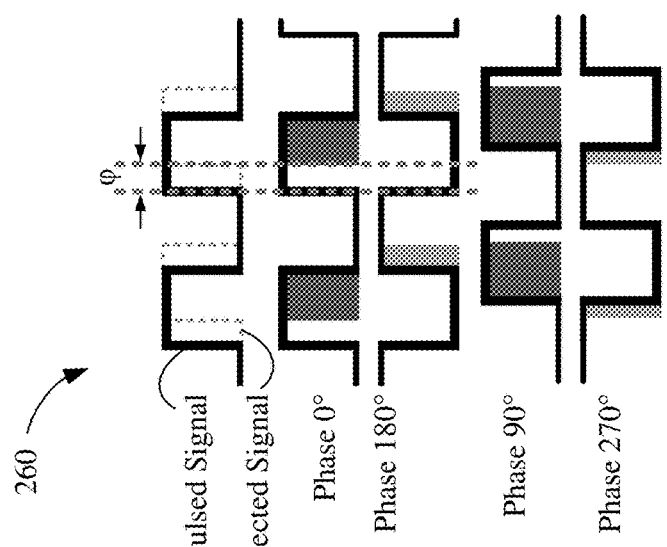
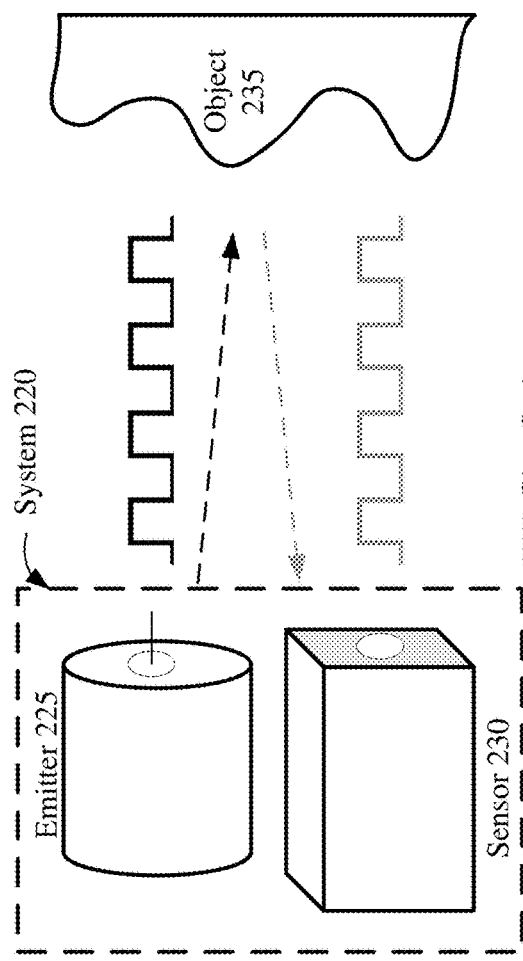
FIG. 2A
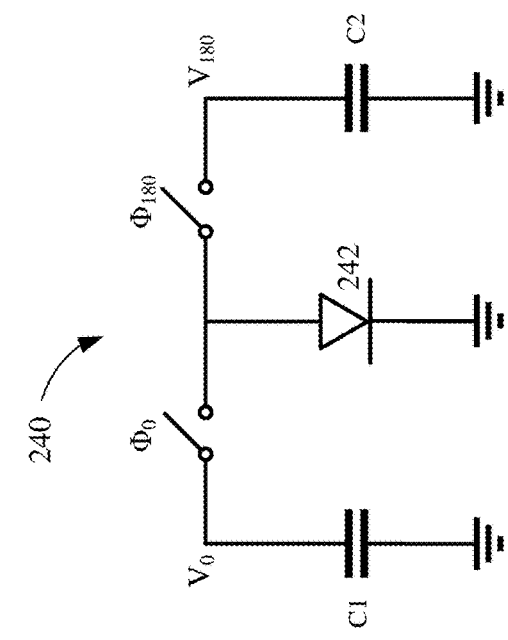
FIG. 2C
FIG. 2B

RESOLVING MULTIPATH INTERFERENCE USING A MIXED ACTIVE DEPTH SYSTEM

CROSS-REFERENCE TO RELATED APPLICATIONS

This patent application claims priority to U.S. Provisional Patent Application No. 62/857,804 entitled "MIXED ACTIVE DEPTH" and filed on Jun. 5, 2019, which is assigned to the assignee hereof. The disclosures of all prior applications are considered part of and are incorporated by reference in this patent application.

TECHNICAL FIELD

This disclosure relates generally to depth sensing systems and specifically to improving the speed and accuracy at which active depth systems generate depth information.

BACKGROUND

A device may determine distances of its surroundings using various active-or-passive depth sensing techniques. Passive depth sensing systems measure reflected ambient light. Active depth sensing systems emit waves from a non-ambient source of light (e.g., an illuminator, a light emitting diode (LED), a laser, or another suitable light source) and measure the corresponding reflected energy. For example, an active depth sensing system, or device, may generate depth information, illustrating or otherwise indicating depths from the device to a scene or one or more objects in the scene. The active depth sensing system may emit one or more light pulses and measure reflections of the light pulses from the objects or scene. Example active depth techniques include time-of-flight (ToF) and structured light (SL).

In a ToF system, light is emitted from a transmitter (or "projector"), and a reflection of the light is received at a receiver (or "sensor"). The round-trip time of the light from the transmitter to the receiver is determined, and the distance or depth of an object reflecting the emitted light can be determined from the round trip time. ToF systems are useful for many applications based on size, accuracy, performance indices, and cost. For example, ToF systems provide depth information faster and more reliably at the hardware level than, for example, stereo multi-camera systems that require more complex processing.

A SL system may include a light emitter (or "transmitter" or "projector") to project a distribution of infrared (IR) light (such as a distribution of IR light points) onto a scene. The system or device may also include a sensor (or "receiver") that senses the reflections of the distribution of light to determine distances of objects in the scene. The emitter and the sensor are separated by a distance, and displacement and distortion of the spatial distribution occurs at the sensor as a result. The SL system determines a distance or depth of an object reflecting the emitted light back to the system, for example, using triangulation with the displacement and distortion of the spatial distribution and the distance between the transmitter and receiver.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Some aspects of the present disclosure relate to a device for depth sensing. An example device includes a light projector, a receiver, a memory storing instructions, and a processor connected to the memory. An example light projector is configured to project light in a first distribution including a flood projection when the device operates in a first mode. The example light projector is further configured to project light in a second distribution including a pattern projection when the device operates in a second mode. An example receiver is configured to detect reflections of light projected by the light projector. An example processor is configured to determine first depth information based on reflections detected by the receiver when the device operates in the first mode. The example processor is further configured to determine second depth information based on reflections detected by the receiver when the device operates in the second mode. The example processor is further configured to resolve multipath interference (MPI) using the first depth information and the second depth information.

Some other aspects of the present disclosure relate to a method for depth sensing using a device. An example method includes projecting light in a first distribution including a flood projection when the device operates in a first mode. The example method further includes projecting light in a second distribution including a pattern projection when the device operates in a second mode. The example method further includes detecting reflections of light projected by the light projector. The example method further includes determining first depth information based on reflections detected by the receiver when the device operates in the first mode. The example method further includes determining second depth information based on reflections detected by the receiver when the device operates in the second mode. The example method further includes resolving multipath interference (MPI) using the first depth information and the second depth information.

Some other aspects of the present disclosure relate to a non-transitory computer-readable medium storing instructions that, when executed by one or more processors of an apparatus, causes the apparatus to perform operations. Example operations include projecting light in a first distribution including a flood projection when the device operates in a first mode. The example operations further include projecting light in a second distribution including a pattern projection when the device operates in a second mode. The example operations further include detecting reflections of light projected by the light projector. The example operations further include determining first depth information based on reflections detected by the receiver when the device operates in the first mode. The example operations further include determining second depth information based on reflections detected by the receiver when the device operates in the second mode. The example operations further include resolving multipath interference (MPI) using the first depth information and the second depth information.

Some other aspects of the present disclosure relate to a device. An example device includes means for projecting light in a first distribution including a flood projection when the device operates in a first mode. The example device further includes means for projecting light in a second distribution including a pattern projection when the device operates in a second mode. The example device further includes means for detecting reflections of light projected by the light projector. The example device further includes means for determining first depth information based on reflections detected by the receiver when the device operates in the first mode. The example device further includes means for determining second depth information based on reflections detected by the receiver when the device operates in the second mode. The example device further includes means for resolving multipath interference (MPI) using the first depth information and the second depth information.

BRIEF DESCRIPTION OF THE DRAWINGS

Aspects of the present disclosure are illustrated by way of example, and not by way of limitation, in the figures of the accompanying drawings and in which like reference numerals refer to similar elements.

FIG. 1 shows an example time-of-flight (ToF) system.

FIG. 2A shows an example ToF system including an emitter and a sensor.

FIG. 2B shows an example sensor pixel.

FIG. 2C shows a pulse diagram illustrating a pulsed signal from a transmitter and a corresponding reflection signal received at a sensor.

DETAILED DESCRIPTION

Figure 3:
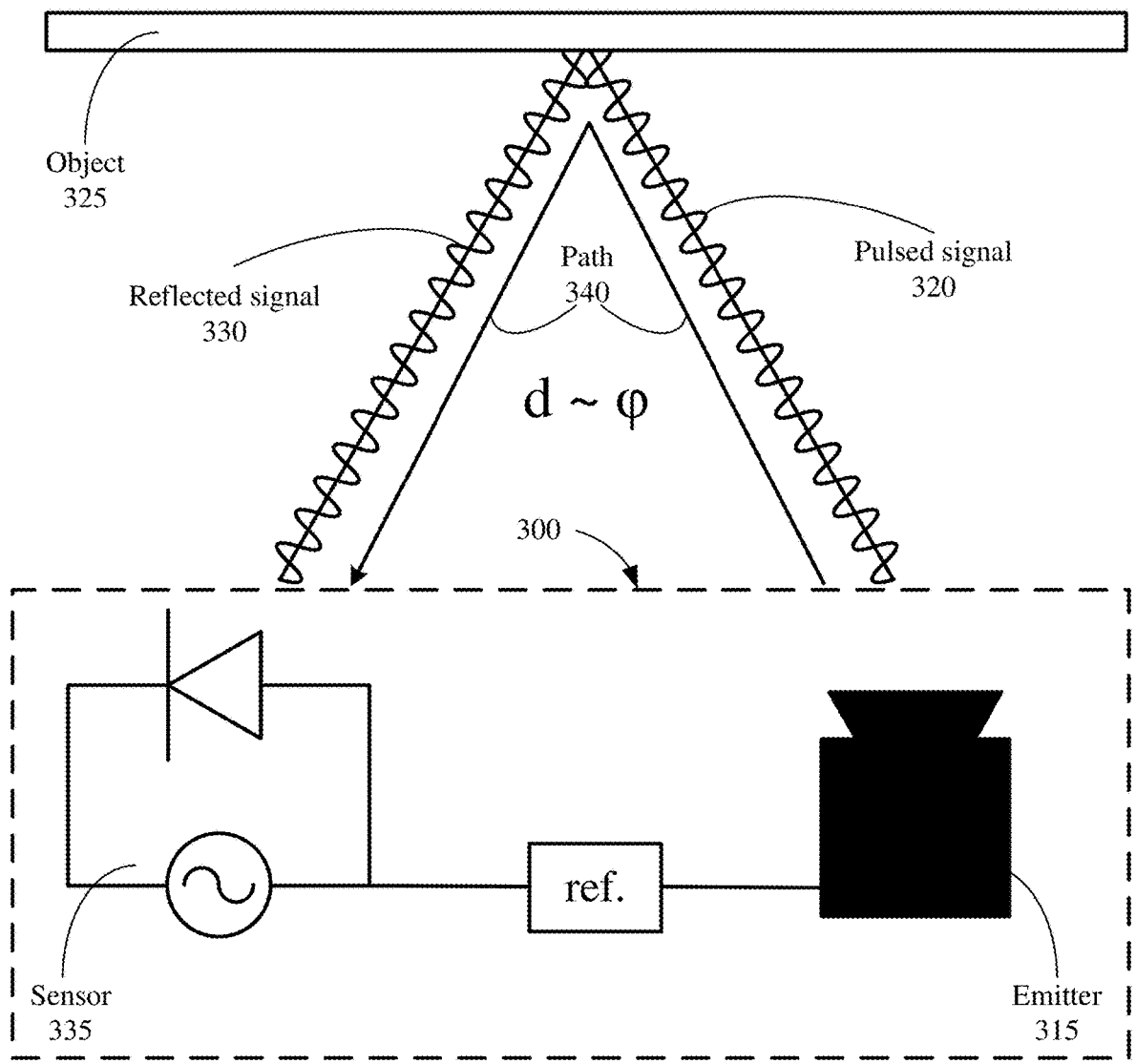
FIG. 3 shows an example ToF system.

Aspects of the present disclosure relate to active depth systems and include a system that incorporates time-of-flight (ToF) and structured light (SL) techniques into a single device. ToF systems generally produce higher resolution depth information than SL systems. However, the depth information generated by conventional ToF systems often suffers from image artifacts induced by multipath interference (MPI). On the other hand, depth information generated by SL systems is relatively unaffected by MPI.

In some aspects of the present disclosure, an active depth sensing system may combine the advantages of ToF (e.g., higher resolution) and SL (e.g., no MPI). For example, the present embodiments disclose an active depth sensing system configured to operate in a mixed ToF and SL mode. The system may determine SL information for an object or scene and utilize the SL information to mitigate the effects of MPI when determining ToF depth information for the object or scene. The system may include a composite sensor, a hybrid emitter, and/or a programmable architecture, thus saving device space and requiring fewer device components than a conventional ToF system while also improving the speed and accuracy at which the system generates depth information.

In the following description, numerous specific details are set forth, such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present disclosure. However, it will be apparent to one skilled in the art that these specific details may not be required to practice the teachings disclosed herein. In other instances, well-known circuits and devices are shown in block diagram form to avoid obscuring teachings of the present disclosure. Some portions of the detailed descriptions which follow are presented in terms of procedures, logic blocks, processes, and other symbolic representations of operations on data bits within a computer memory. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving," "settling," or the like, refer to the actions and processes of a computer system, or similar electronic computing device, that manipulates and transforms data represented as physical (electronic) quantities within the computer system registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps are described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example devices may include components other than those shown, including well-known components such as a processor, memory and the like.

Aspects of the present disclosure are applicable to any suitable electronic device (such as security systems, smartphones, tablets, laptop computers, vehicles, drones, or other devices) including or coupled to one or more active depth sensing systems. While described below with respect to a device having or coupled to one light projector, aspects of the present disclosure are applicable to devices having any number of light projectors, and are therefore not limited to specific devices.

The term "device" is not limited to one or a specific number of physical objects (such as one smartphone, one controller, one processing system, and so on). As used herein, a device may be any electronic device with one or more parts that may implement at least some portions of this disclosure. While the below description and examples use the term "device" to describe various aspects of this disclosure, the term "device" is not limited to a specific configuration, type, or number of objects. Additionally, the term "system" is not limited to multiple components or specific embodiments. For example, a system may be implemented on one or more printed circuit boards or other substrates, and may have movable or static components. While the below description and examples use the term "system" to describe various aspects of this disclosure, the term "system" is not limited to a specific configuration, type, or number of objects.

FIG. 1 shows an example ToF system 100. The ToF system 100 may be used to generate depth information of a scene including a surface 106, or may be used for other applications for ranging surfaces or other portions of the scene. The ToF system 100 may include a transmitter 102 and a receiver 108. The transmitter 102 may be referred to as a "light projector," "transmitter," "projector," "emitter," and so on, and should not be limited to a specific transmission component. Similarly, the receiver 108 may be referred to as a "light sensor," "detector," "sensor," "sensing element," "photodetector," and so on, and should not be limited to a specific receiving component.

The transmitter 102 may be configured to transmit, emit, or project signals (such as a field of light) onto the scene. While ToF systems are described in the examples as emitting light (which may include near-infrared (NIR)), signals at other frequencies may be used, such as microwaves, radio frequency signals, sound, and so on. The present disclosure should not be limited to a specific range of frequencies for the emitted signals.

The transmitter 102 transmits light 104 toward a scene including a surface 106. The transmitted light 104 includes light pulses 114 at known time intervals (such as at a regular time interval). The receiver 108 includes a sensor 110 to sense the reflections 112 of the transmitted light 104. The reflections 112 include the reflected light pulses 116, and the ToF system 100 determines a round trip time 122 for the light by comparing the timing 118 of the transmitted light pulses to the timing 120 of the reflected light pulses 116. The distance of the surface 106 from the ToF system 100 may be calculated to be half the round trip time multiplied by the speed of the emissions (such as the speed of light for light emissions).

The sensor 110 may include an array of photodiodes to measure or sense the reflections. Alternatively, the sensor 110 may include a CMOS sensor or other suitable photosensitive sensor including a number of pixels or regions for sensing. The ToF system 100 identifies the reflected light pulses 116 as sensed by the sensor 110 when the magnitudes of the pulses are greater than a value. For example, the ToF system 100 measures a magnitude of the ambient light and other interference without the signal and determines if further measurements are greater than the previous measurement by a value. FIG. 2A shows an example ToF system 220 including an emitter 225 and a sensor 230. The emitter 225 transmits light pulses toward an object 235, and the light pulses are reflected back by the object 235 toward the sensor 230. The light reflected back to the sensor 230 may have a different phase than the light emitted from the emitter 225.

FIG. 2B shows an example sensor pixel 240 that may be included, for example, in the sensor 230. The sensor pixel 240 includes a photodiode 242 for converting photons from the reflected light into electrical current. The sensor pixel 240 may also include one or more capacitors (e.g., C1 and C2) to store energy from the current. The ToF system 220 may calculate a distance between the ToF system 220 and the object 235 in part by comparing the voltages (e.g., V0 and V180) with their corresponding phases (e.g., $\Phi0$ and $\Phi180$, respectively).

FIG. 2C shows a pulse diagram 260 illustrating a pulsed signal emitted from the emitter 225 and a corresponding reflection of the pulsed signal (e.g., reflected by an object, such as the object 235 of FIG. 2A) received at the sensor 230. The reflected signal is phase-delayed relative to the pulsed signal. The ToF system 220 may open and close a shutter to expose the sensor 230 at a number of particular phase offsets (e.g., Phase 0°, Phase 180°, Phase 90°, and Phase 270°) relative to the pulsed signal. During each exposure cycle (shaded in gray), electrical charge may be stored by one or more storage elements, such as by capacitors C1 and C2 of FIG. 2B. For example, during a first exposure cycle, C1 may store a charge (Q1) and C2 may store a charge (Q2), where Q1 is the accumulated charge from the reflected signal when the shutter is open at the 0° phase offset, and where Q2 is the accumulated charge from the reflected signal when the shutter is open at the 180° phase offset. During a second exposure cycle, C1 may store a charge (Q3) and C2 may store a charge (Q4), where Q3 is the accumulated charge from the reflected signal when the shutter is open at the 90° phase offset, and where Q4 is the accumulated charge from the reflected signal when the shutter is open at the 270° phase offset. The ToF system 220 can calculate the phase offset (φ) between the pulsed signal and the reflected signal based on the charges stored across C1 and C2 for each of the exposure cycles:

$$\varphi = \tan^{-1}\frac{Q3 - Q4}{Q1 - Q2}$$

The calculated phase offset φ between the pulsed signal and the reflected signal is proportional to the distance d between the corresponding sensor pixel (such as the sensor pixel 240) and the object 235:

$$d = \left(\frac{c}{2f}\right) * \left(\frac{\varphi}{2\pi}\right)$$

where c is the speed of light and f is the frequency of the modulated signal. Based on the determined distances from each pixel of the sensor 230 to the object 235, the ToF system 220 may generate depth information for the object in the scene.

FIG. 3 shows an example ToF system 300. The ToF system 300 includes an emitter 315 and a sensor 335. The emitter 315 pulses a signal 320 toward an object 325, and the sensor 335 receives a corresponding reflected signal 330. The pulsed signal 320 may be a modulated continuous-wave (AMCW) pulse of light. As described in connection with FIG. 2C, the ToF system 300 may determine a distance d from one or more pixels of the sensor 335 based on a proportional correlation to the phase difference φ between the pulsed signal 320 and the reflected signal 330. The pulsed signal 320 and the reflected signal 330 may follow a direct path 340.

Some environments (e.g., with corners, convex areas, and/or reflective surfaces) may cause different pulses of light to arrive at the ToF system sensor along multiple reflection paths and recombine at the sensor, which is known as MPI. For purposes of discussion herein, MPI may also be referred to as "multipath effects" or "MPI effects." MPI may cause the ToF system to overestimate the amount of charge being accumulated for one or more phase offsets of the corresponding pulsed signal. The overestimation may cause the ToF system to inaccurately calculate the corresponding phase shift φ between the pulsed and reflected signals. Thus, the ToF system may inaccurately calculate the corresponding distance d from one or more of the sensor pixels to the object or scene, which may cause distortions (or "bumps") in corresponding depth information.

Figure 4C:
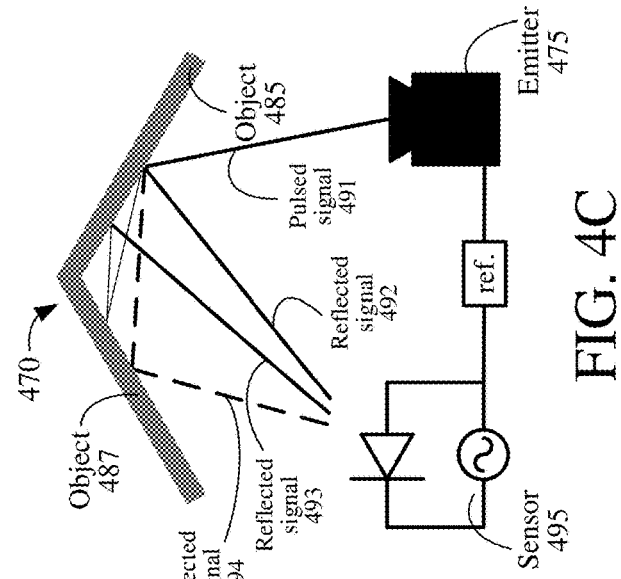
FIG. 4C shows another example environment in which MPI may affect ToF depth sensing.
Figure 4A:
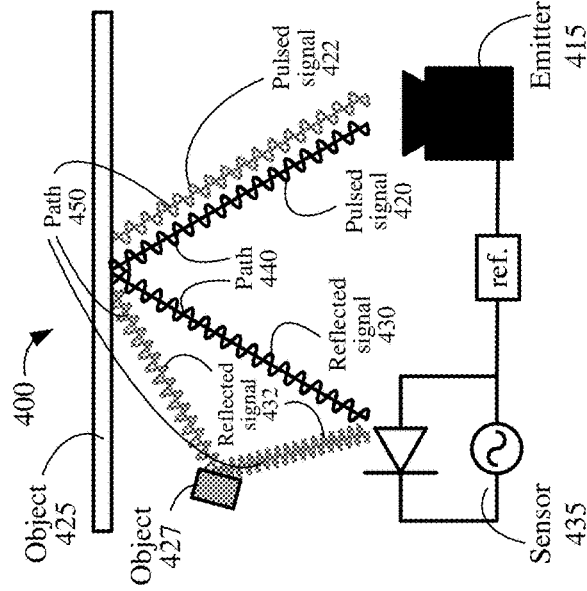
FIG. 4A shows an example environment in which multipath interference (MPI) may affect ToF depth sensing.

FIG. 4A shows an example environment 400 in which MPI may affect ToF depth sensing. The ToF system includes an emitter 415 and a sensor 435. The scene includes an object 425 and an object 427. The object 427 may have a mirror-like surface. The emitter 415 transmits a pulsed signal 420 and a pulsed signal 422 toward the object 425. The sensor 435 receives corresponding reflected signal 430 and reflected signal 432, respectively. Similar to the pulsed signal 320 and the reflected signal 330 of FIG. 3, the pulsed signal 420 and the reflected signal 430 follow a direct path 440. In contrast, the pulsed signal 422 and the reflected signal 432 follow an indirect path 450 (e.g., reflecting off of the object 427) such that the reflected signal 432 may arrive at the sensor 435 at the same time as the reflected signal 430, causing MPI.

Figure 4B:
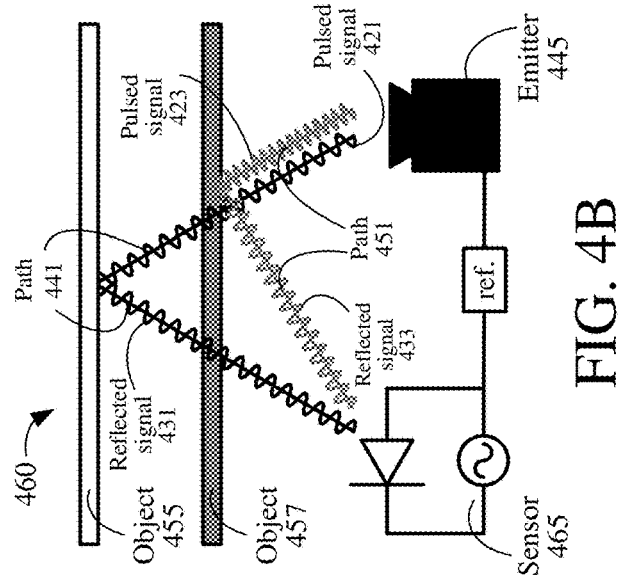
FIG. 4B shows another example environment in which MPI may affect ToF depth sensing.

FIG. 4B shows another example environment 460 in which MPI may affect ToF depth sensing. The ToF system includes an emitter 445 and a sensor 465. The scene includes an object 455 and an object 457. The object 457 may have a semi-transparent surface. The emitter 445 transmits a pulsed signal 421 and a pulsed signal 423. The sensor 465 receives corresponding reflected signal 431 and reflected signal 433, respectively. The pulsed signal 421 and the reflected signal 431 follow path 441 (e.g., reflecting off of the object 455). The pulsed signal 423 and the reflected signal 433 follow path 451 (e.g., reflecting off of the object 457). The reflected signal 433 may arrive at the sensor 465 at the same time as the reflected signal 431, causing MPI.

FIG. 4C shows another example environment 470 in which MPI may affect ToF depth sensing. The ToF system includes an emitter 475 and a sensor 495. The scene includes an object 485 and an object 487, which may represent two walls that intersect at a corner point. The emitter 475 transmits a pulsed signal 491 toward the object 485, and the sensor 495 receives the corresponding reflected signal 492. In addition, possibly due to the reflective properties of the object 485 or the object 487, reflected signal 493 and reflected signal 494 may arrive at the sensor 495 at the same time as the reflected signal 492, causing MPI.

Figures 5A, 5B:
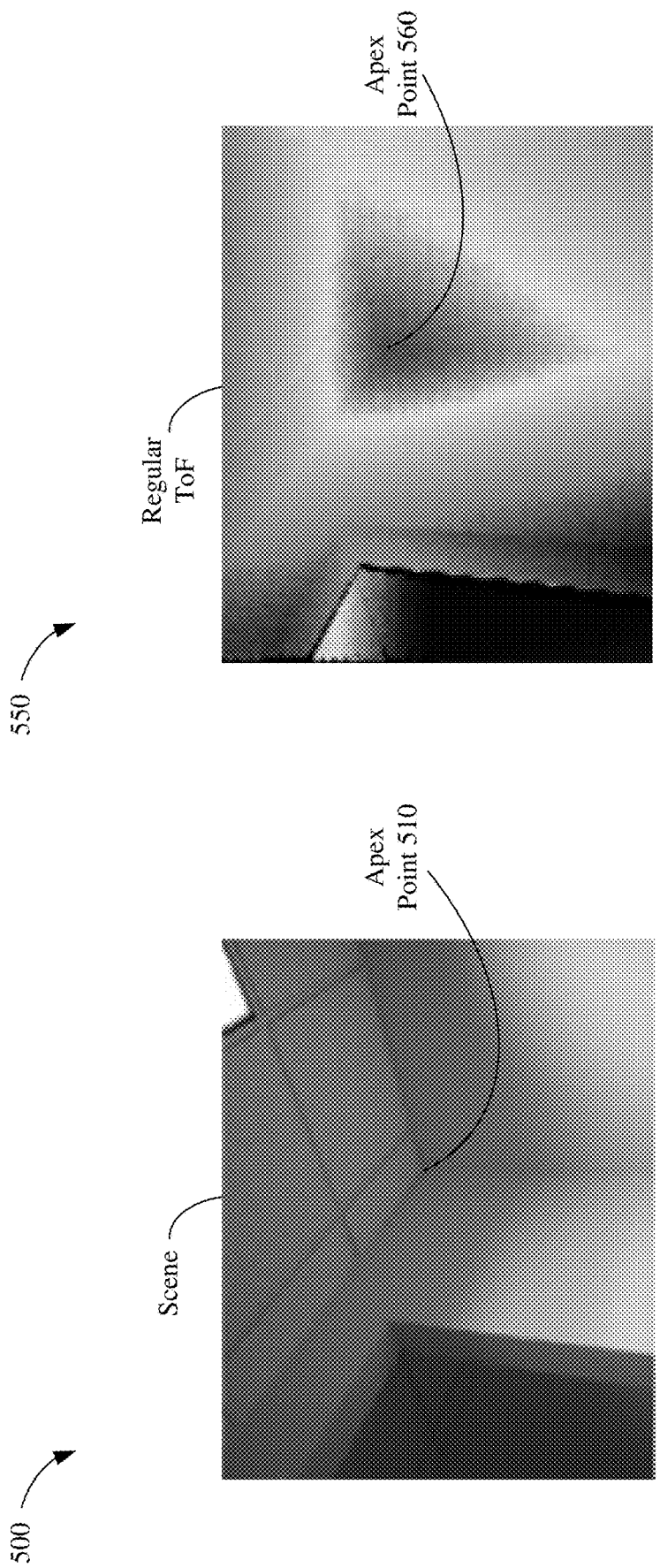
FIG. 5A shows an example scene including a corner of a room with an apex point where two of the walls intersect with the ceiling.
FIG. 5B shows an example depth map of the scene from FIG. 5A as generated by a conventional ToF system.

FIG. 5A shows an example scene 500 including a corner of a room with an apex point 510 where two of the walls intersect with the ceiling. It will be understood that the apex point 510 is the furthest point (e.g., the point having the highest z-distance) from the sensor of the ToF system. FIG. 5B shows an example depth map 550 of the scene from FIG. 5A as generated by a conventional ToF system ("regular ToF"). However, similar to the example environment 470 of FIG. 4C, multiple reflected signals may arrive at the sensor (e.g., due to the corner of the room with apex point 560), causing MPI. A conventional ToF system may superimpose the multiple reflected signals, ultimately resulting in the corresponding region in the depth map 550 appearing to have a uniform depth.

Figure 6:
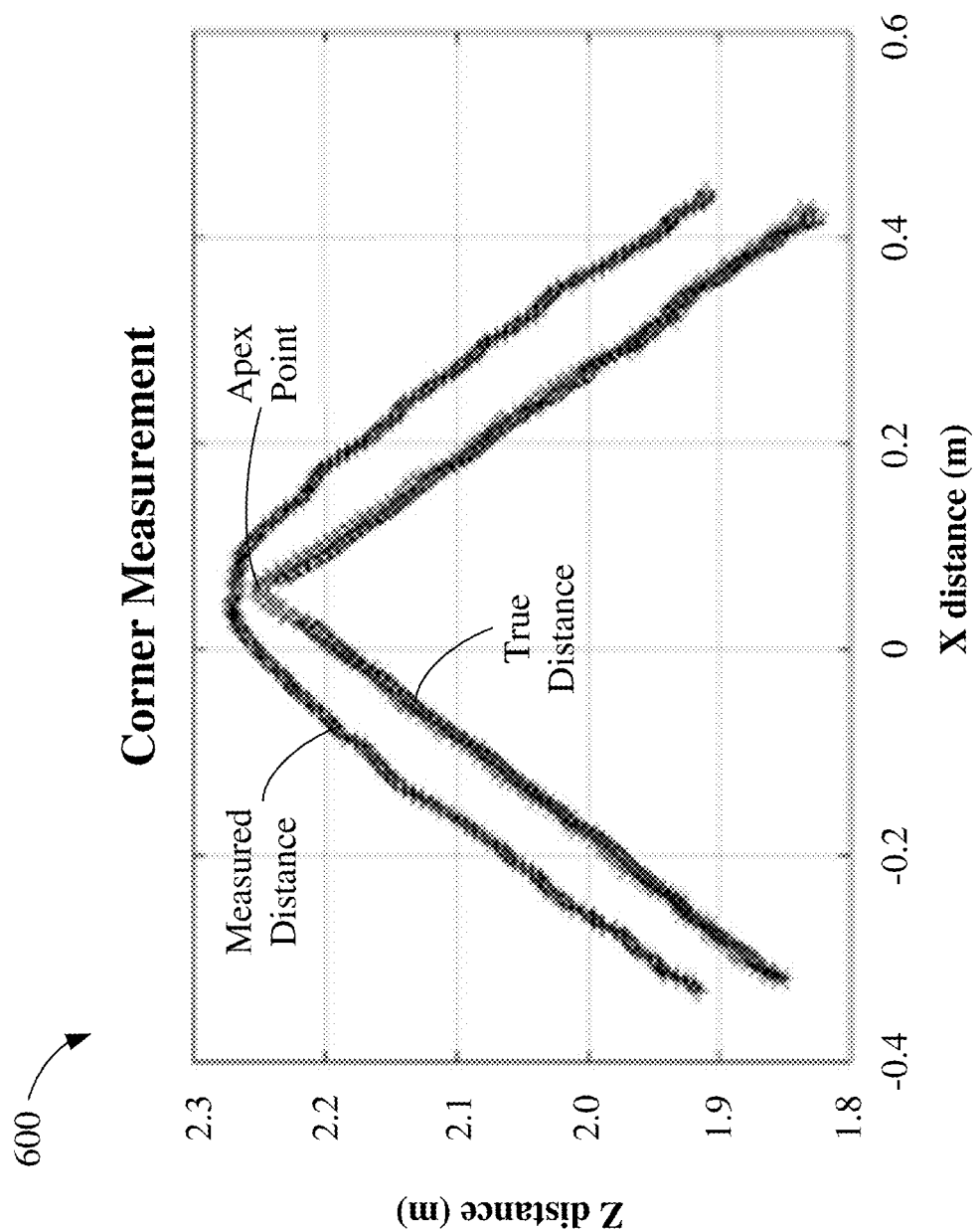
FIG. 6 shows a graph of the corresponding X-distance and Z-distance for the scene of FIG. 5A.

To illustrate, FIG. 6 shows a graph 600 of a corresponding X-distance as measured by a ToF system and a corresponding Z-distance as measured by a ToF system for the scene 500 of FIG. 5A. The x-distance may represent a horizontal distance (in meters, m) from the center of the scene at 0 m. The z-distance may represent a depth distance from the sensor of the ToF system to an object in the scene, such as a surface of a wall. The bottom plot represents the actual ("true") x-distance and z-distance for the corner, while the top plot represents the distance measured by the ToF system.

The true distance plot accurately shows the apex point of the corner of the room, which comes to a sharp point. The measured distance plot depicts the apex point as a bowl-like curve. This inaccurate measurement yields incorrect distance calculations, such as shown in the depth map 550 of FIG. 5B.

Figure 7:
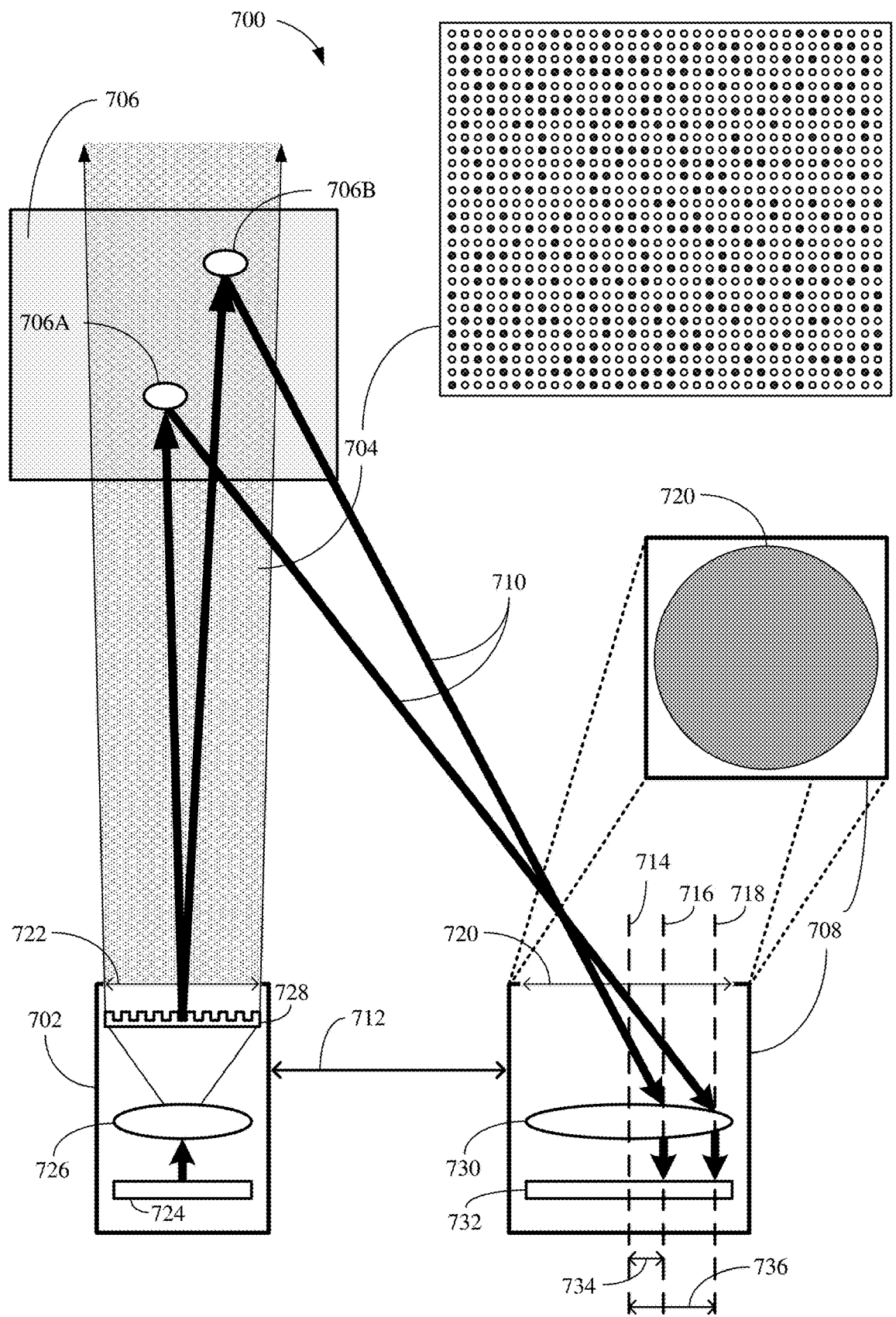
FIG. 7 shows an example structured light (SL) system.

FIG. 7 shows an example SL system 700. As described above, SL is relatively unaffected by MPI and generally produces lower (more sparse) resolution depth information than ToF systems (e.g., the ToF system 100 of FIG. 1). A SL system may transmit light in a distribution of points (or another suitable shape of focused light). For purposes of discussion herein, the distribution of points may be referred to as a "pattern," a "SL pattern," a "dot pattern," or the like, and the pattern may be predefined or random. The points of light may be projected on to a scene, and the reflections of the points of light may be received by the SL system. Depths of objects in a scene may be determined by comparing the pattern of the received light and the pattern of the transmitted light. In comparing the patterns, a portion of the predefined distribution for the transmitted light may be identified in the received light. A SL system may project a distribution of light (such as a distribution of light points or other shapes) using a structured light projector.

The light distribution emitted by a SL projector may not change. Denser distributions of light (such as additional light points or more instances of focused light in an area than for sparser distributions of light) may result in a higher resolution of depth information or a greater number of depths that may be determined. However, the intensity of individual light points are lower for denser distributions than for sparser distributions where the overall intensity is similar between the distribution. As a result, interference may cause identifying reflections of a denser distribution of light to be more difficult than for sparser distributions of light. For example, a SL projector may project IR light (such as NIR light) with a 905 nm or 940 nm wavelength (or other suitable wavelength). A SL receiver may receive reflections of the IR light as well as sunlight and other ambient light. Ambient light may cause interference of the IR light points. As a result, brightly lit scenes (such as outdoor scenes in daylight) may cause more interference than darker scenes (such as indoor scenes or nighttime scenes) because of the additional ambient light being captured by the SL receiver.

The SL system 700 (which herein may also be called a SL system) may be used to generate depth information for a scene 706. For example, the scene 706 may include a face, and the SL system 700 may be used for identifying or authenticating the face. The SL system 700 may include a transmitter 702 and a receiver 708. The transmitter 702 may be referred to as a "transmitter," "projector," "emitter," and so on, and should not be limited to a specific transmission component. Throughout the following disclosure, the terms projector and transmitter may be used interchangeably. The receiver 708 may be referred to as a "detector," "sensor," "sensing element," "photodetector," and so on, and should not be limited to a specific receiving component.

While the disclosure refers to the distribution as a light distribution, any suitable signals at other frequencies may be used (such as radio frequency waves, sound waves, etc.). Further, while the disclosure refers to the distribution as including a plurality of light points, the light may be focused into any suitable size and dimensions. For example, the light may be projected in lines, squares, or any other suitable dimension. In addition, the disclosure may refer to the distribution as a codeword distribution, where a defined portion of the distribution (such as a predefined patch of light points) is referred to as a codeword. If the distribution of the light points is known, the codewords of the distribution may be known. However, the distribution may be organized in any way, and the present disclosure should not be limited to a specific type of distribution or type of signal or pulse.

The transmitter 702 may be configured to project or transmit a distribution 704 of light points onto the scene 706. The white circles in the distribution 704 may indicate where no light is projected for a possible point location, and the black circles in the distribution 704 may indicate where light is projected for a possible point location. In some example implementations, the transmitter 702 may include one or more light sources 724 (such as one or more lasers), a lens 726, and a light modulator 728. The transmitter 702 may also include an aperture 722 from which the transmitted light escapes the transmitter 702. In some implementations, the transmitter 702 may further include a diffractive optical element (DOE) to diffract the emissions from one or more light sources 724 into additional emissions. In some aspects, the light modulator 728 (to adjust the intensity of the emission) may include a DOE. In projecting the distribution 704 of light points onto the scene 706, the transmitter 702 may transmit one or more lasers from the light source 724 through the lens 726 (and/or through a DOE or light modulator 728) and onto the scene 706. The transmitter 702 may be positioned on the same reference plane as the receiver 708, and the transmitter 702 and the receiver 708 may be separated by a distance called the baseline (712).

In some example implementations, the light projected by the transmitter 702 may be IR light. IR light may include portions of the visible light spectrum and/or portions of the light spectrum that is not visible to the naked eye. In one example, IR light may include NIR light, which may or may not include light within the visible light spectrum, and/or IR light (such as far infrared (FIR) light) which is outside the visible light spectrum. The term IR light should not be limited to light having a specific wavelength in or near the wavelength range of IR light. Further, IR light is provided as an example emission from the transmitter. In the following description, other suitable wavelengths of light may be used. For example, light in portions of the visible light spectrum outside the IR light wavelength range or ultraviolet light. Alternatively, other signals with different wavelengths may be used, such as microwaves, radio frequency signals, and other suitable signals.

The scene 706 may include objects at different depths from the SL system (such as from the transmitter 702 and the receiver 708). For example, objects 706A and 706B in the scene 706 may be at different depths. The receiver 708 may be configured to receive, from the scene 706, reflections 710 of the transmitted distribution 704 of light points. To receive the reflections 710, the receiver 708 may capture an image. When capturing the image, the receiver 708 may receive the reflections 710, as well as (i) other reflections of the distribution 704 of light points from other portions of the scene 706 at different depths and (ii) ambient light. Noise may also exist in the captured image.

In some example implementations, the receiver 708 may include a lens 730 to focus or direct the received light (including the reflections 710 from the objects 706A and 706B) on to the sensor 732 of the receiver 708. The receiver 708 may also include an aperture 720. Assuming for the example that only the reflections 710 are received, depths of the objects 706A and 706B may be determined based on the baseline 712, displacement and distortion of the light distribution 704 (such as in codewords) in the reflections 710, and intensities of the reflections 710. For example, the distance 734 along the sensor 732 from location 716 to the center 714 may be used in determining a depth of the object 706B in the scene 706. Similarly, the distance 736 along the sensor 732 from location 718 to the center 714 may be used in determining a depth of the object 706A in the scene 706. The distance along the sensor 732 may be measured in terms of number of pixels of the sensor 732 or a distance (such as millimeters).

In some example implementations, the sensor 732 may include an array of photodiodes (such as avalanche photodiodes) for capturing an image. To capture the image, each photodiode in the array may capture the light that hits the photodiode and may provide a value indicating the intensity of the light (a capture value). The image therefore may be the capture values provided by the array of photodiodes.

In addition or alternative to the sensor 732 including an array of photodiodes, the sensor 732 may include a complementary metal-oxide semiconductor (CMOS) sensor. To capture the image by a photosensitive CMOS sensor, each pixel of the sensor may capture the light that hits the pixel and may provide a value indicating the intensity of the light. In some example implementations, an array of photodiodes may be coupled to the CMOS sensor. In this manner, the electrical impulses generated by the array of photodiodes may trigger the corresponding pixels of the CMOS sensor to provide capture values.

The sensor 732 may include at least a number of pixels equal to the number of possible light points in the distribution 704. For example, the array of photodiodes or the CMOS sensor may include a number of photodiodes or a number of pixels, respectively, corresponding to the number of possible light points in the distribution 704. The sensor 732 logically may be divided into groups of pixels or photodiodes (such as 4×4 groups) that correspond to a size of a bit of a codeword. The group of pixels or photodiodes may also be referred to as a bit, and the portion of the captured image from a bit of the sensor 732 may also be referred to as a bit. In some example implementations, the sensor 732 may include the same number of bits as the distribution 704.

If the light source 724 transmits IR light (such as NIR light at a wavelength of, e.g., 940 nm), the sensor 732 may be an IR sensor to receive the reflections of the NIR light. The sensor 732 may also be configured to capture an image using a flood illuminator (not illustrated). As illustrated, the distance 734 (corresponding to the reflections 710 from the object 706B) is less than the distance 736 (corresponding to the reflections 710 from the object 706A). Using triangulation based on the baseline 712 and the distances 734 and 736, the differing depths of objects 706A and 706B in the scene 706 may be determined in generating depth information for the scene 706. Determining the depths may further include determining a displacement or a distortion of the distribution 704 in the reflections 710.

Although multiple separate components are illustrated in FIG. 7, one or more of the components may be implemented together or include additional functionality. All described components may not be required for a SL system 700, or the functionality of components may be separated into separate components. Additional components not illustrated may also exist. For example, the receiver 708 may include a bandpass filter to allow signals having a determined range of wavelengths to pass onto the sensor 732 (thus filtering out signals with a wavelength outside of the range). In this manner, some incidental signals (such as ambient light) may be prevented from interfering with the captures by the sensor 732. The range of the bandpass filter may be centered at the transmission wavelength for the transmitter 702. For example, if the transmitter 702 is configured to transmit NIR light with a wavelength of 940 nm, the receiver 708 may include a bandpass filter configured to allow NIR light having wavelengths within a range of, e.g., 920 nm to 960 nm. Therefore, the examples described regarding FIG. 7 are for illustrative purposes, and the present disclosure should not be limited to the example SL system 700.

For a light projector (such as the transmitter 702), the light source may be any suitable light source. In some example implementations, the light source 724 may include one or more distributed feedback (DFB) lasers. In some other example implementations, the light source 724 may include one or more vertical-cavity surface-emitting lasers (VCSELs).

A DOE is a material situated in the projection path of the light from the light source. The DOE may be configured to split a light point into multiple light points. For example, the material of the DOE may be a translucent or a transparent polymer with a known refractive index. The surface of the DOE may include peaks and valleys (varying the depth of the DOE) so that a light point splits into multiple light points when the light passes through the DOE. For example, the DOE may be configured to receive one or more lights points from one or more lasers and project an intended distribution with a greater number of light points than emitted by the one or more lasers. While the Figures may illustrate the depth of a DOE changing along only one axis of the DOE, the Figures are only to assist in describing aspects of the disclosure. The peaks and valleys of the surface of the DOE may be located at any portion of the surface of the DOE and cause any suitable change in the depth of portions of the DOE, and the present disclosure should not be limited to a specific surface configuration for a DOE.

If the light source 724 includes an array of lasers (such as a VCSEL array), a portion of the distribution of light points may be projected by the array. A DOE may be used to replicate the portion in projecting the distribution of light points. For example, the DOE may split the projection from the array into multiple instances, and a pattern of the projection may be a repetition of the projection from the array. In some example implementations, the DOE may be configured to repeat the projection vertically, horizontally, or at an angle between vertical and horizontal relative to the projection. The repeated instances may be overlapping, non-overlapping, or any suitable configuration. While the examples describe a DOE configured to split the projection from the array and stack the instances above and below one another, the present disclosure should not be limited to a specific type of DOE configuration and repetition of the projection.

Figure 8:
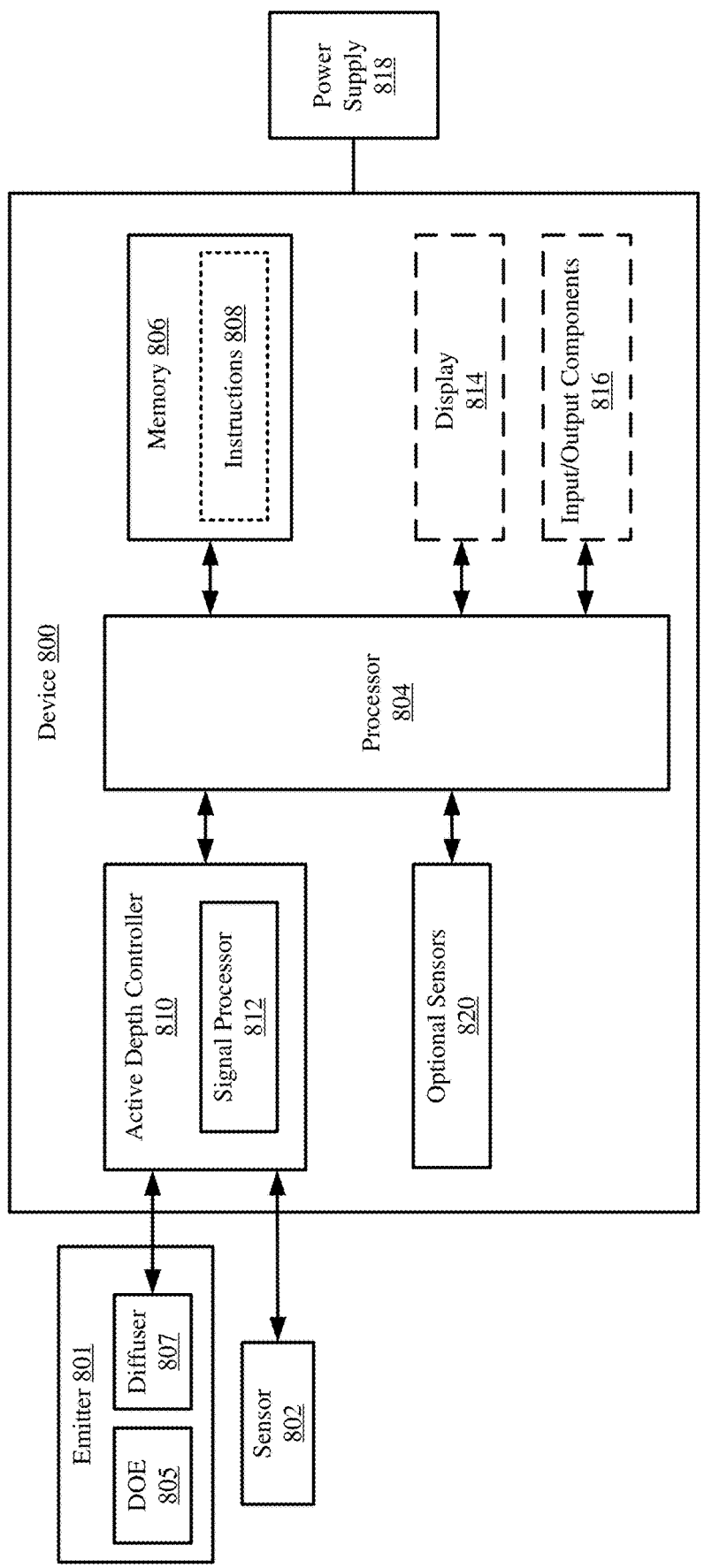
FIG. 8 shows a block diagram of an example device including a mixed ToF and SL system.

FIG. 8 shows a block diagram of an example device 800 configured for active depth sensing using ToF and SL techniques. It will be understood that ToF and SL are example active depth techniques and that the device 800 may use other active depth techniques in some implementations. In some embodiments, the device 800 may be configured to generate high-resolution depth information using ToF techniques while using SL techniques to mitigate the effects of MPI in the depth information. The device 800 may include or be coupled to an emitter 801, a sensor 802, a processor 804, a memory 806 storing instructions 808, and an active depth controller 810 (which may include one or more signal processors 812). The emitter 801 may include or be coupled to a DOE 805. The DOE 805 may optionally be included in or coupled to the device 800. The emitter 801 may include or be coupled to a diffuser 807. The diffuser 807 may optionally be included in or coupled to the device 800. For purposes of discussion herein, the device 800 may be referred to as a "ToF and SL system." Further for purposes of discussion herein, the "ToF and SL system" may instead refer to just one or more components of the device 800 (e.g., the active depth controller 810, the emitter 801, the sensor 802, the DOE 805, and/or the diffuser 807) and/or any other components that may be used for active depth sensing. In some implementations, the device may be a wireless communication device.

In some embodiments, the emitter 801 may be a single, hybrid laser projector capable of switching between projecting a first distribution of light (e.g., with use of the diffuser 807) during a first projection mode (e.g., a ToF projection mode) of the emitter 801 and projecting a second distribution of light (e.g., with use of the DOE 805) during a second projection mode (e.g., a SL projection mode) of the emitter 801. When operating in the SL projection mode, the DOE 805 may enable the emitter 801 to transmit the second distribution of light, which may be, for example, a known DOE dot pattern, a codeword DOE projection, a random dot projection or distribution, or the like. The diffuser 807 may be switchable such that the diffuser is "off" (or "disabled" or "switched off") when the device 800 operates in the SL projection mode and is "on" (or "enabled" or "switched on") when the device 800 operates in the ToF projection mode. More specifically, when operating in the ToF projection mode, the diffuser 807 is switched on, which causes the emitter 801 to transmit the second distribution of light (e.g., flood distribution). Accordingly, the emitter 801 may be synchronized to project a second distribution of light (e.g., a DOE distribution) during the SL projection mode and a second distribution of light (e.g., a full flood frame) during a ToF projection mode. In some embodiments, the emitter 801 may include multiple projectors.

In some embodiments, the sensor 802 may be a single, hybrid ToF and SL sensor for receiving reflected light according to ToF and SL sensing (or "readout") modes. The sensor 802 may be configured to switch between operating in a first sensing mode (e.g., a ToF sensing mode) and a second sensing mode (e.g., a SL sensing mode). For example, the sensor 802 may be a composite CMOS image sensor configured to switch between operating in (or alternating between) the ToF and SL sensing modes. The sensing mode may depend on which distribution (e.g., DOE or flood) the emitter 801 is projecting. In some aspects, the sensor 802 may be based on a monolithic pixel array architecture, for example, with Time-Division Multiplexed Read (TDMR) capabilities. In other embodiments, the sensor 802 may include one or more generic ToF sensors operating in conjunction with multiple projectors.

In some embodiments, the active depth controller 810 may be a computation element for calculating depth information. The active depth controller 810 may be configured to alternate between computing depth information using ToF techniques and computing depth information using SL techniques. For purposes of discussion herein, depth information calculated using SL techniques may also be referred to as "SL depth information," "SL information," or the like. Similarly, for purposes of discussion herein, depth information calculated using ToF techniques may also be referred to as "ToF depth information," "ToF information," or the like. In some aspects, the active depth controller 810 may use SL depth information as reference for calculating or supplementing ToF depth information, which may help compensate for MPI errors in the ToF depth information. In some embodiments, the sensor 802 may be a Reconfigurable Instruction Cell Array (RICA), which is a proprietary, real-time, low-power, (re)programmable, image signal processing (ISP), active sensing, processing engine. In some aspects, stacking the RICA programmable implementation with the hybrid NIR sensor described herein may enable the active depth controller 810 to switch programming "on-the-fly" to toggle computing SL depth information and ToF depth information while reducing a number of components for a sensor (e.g., the sensor 802). In other embodiments, the active depth controller 810 may be a generic sensor.

In some aspects, the active depth controller 810 may be configured to control (or otherwise operate) at least one of the emitter 801 and the sensor 802 to synchronize their respective operating modes, such that the emitter 801 and the sensor 802 concurrently operate in either their respective SL modes or ToF modes. In some aspects, the active depth controller 810 may be controlled, work in conjunction with, or otherwise be operated by one or more other components of the device 800, such as the processor 804 and/or the memory 806.

The device 800 may optionally include or be coupled to a display 814 and a number of input/output (I/O) components 816. The sensor 802 may be, or otherwise may be coupled to, a camera, such as a single camera, a dual camera module, or a module with any number of other camera sensors (not pictured). The signal processor 812 may be configured to process captures from the sensor 802. The device 800 may further include one or more optional sensors 820 (such as a gyroscope, magnetometer, inertial sensor, NIR sensor, and so on) coupled to the processor 804. The device 800 may also include a power supply 818, which may be coupled to or integrated into the device 800. The device 800 may include additional features or components not shown.

The memory 806 may be a non-transient or non-transitory computer readable medium storing computer-executable instructions 808 to perform all or a portion of one or more operations described in this disclosure. The processor 804 may be one or more suitable processors capable of executing scripts or instructions of one or more software programs (such as instructions 808) stored within the memory 806. In some aspects, the processor 804 may be one or more general purpose processors that execute instructions 808 to cause the device 800 to perform any number of functions or operations. In additional or alternative aspects, the processor 804 may include integrated circuits or other hardware to perform functions or operations without the use of software. While shown to be coupled to each other via the processor 804 in the example of FIG. 8, the processor 804, the memory 806, the active depth controller 810, the optional display 814, the optional I/O components 816, and the optional sensors 820 may be coupled to one another in various arrangements. For example, the processor 804, the memory 806, the active depth controller 810, the optional display 814, the optional I/O components 816, and/or the optional sensors 820 may be coupled to each other via one or more local buses (not shown for simplicity).

The display 814 may be any suitable display or screen allowing for user interaction and/or to present items (such as depth information or a preview image of the scene) for viewing by a user. In some aspects, the display 814 may be a touch-sensitive display. The I/O components 816 may be or include any suitable mechanism, interface, or device to receive input (such as commands) from the user and to provide output to the user. For example, the I/O components 816 may include (but are not limited to) a graphical user interface, keyboard, mouse, microphone and speakers, squeezable bezel or border of the device 800, physical buttons located on device 800, and so on. The display 814 and/or the I/O components 816 may provide a preview image or depth information for the scene to a user and/or receive a user input for adjusting one or more settings of the device 800 (such as adjusting an intensity of emissions by emitter 801, determining or switching one or more operating modes of the device 800, adjusting a field of emission of the emitter 801, and so on).

The active depth controller 810 may include, or may otherwise be coupled to, a signal processor 812, which may be one or more processors to process captures from the sensor 802. The active depth controller 810 may be configured to switch at least one of the emitter 801 and the sensor 802 between one or more operating modes. The active depth controller 810 may alternatively or additionally include a combination of specific hardware and the ability to execute software instructions.

The emitter 801 may vary its field of emission for different operating modes. In some example implementations, the emitter 801 may include a focusing apparatus for adjusting the size of the field of emission/transmission. In one example, mirrors attached to actuators (such as microelectromechanical systems (MEMS) actuators) may adjust the focus of the light emissions from the emitter 801. In another example, an adjustable holographic optical element (HOE) may adjust the focus of the light emissions from the emitter 801. In a further example, a formable DOE (such as a piezoelectric material to adjust the shape) may be adjusted to focus the diffracted points of light emitted.

In some other example implementations, the device 800 may emit light using a plurality of light emitters (not shown) instead of, or in combination with, the emitter 801. The emitters may include a first group of light emitters (e.g., of a first array of light emitters) for emitting light with a first field of transmission. The emitters may further include a second or different group of light emitters (e.g., of a second array of light emitters) for emitting light with a second field of transmission. The first field may be larger than the second field at a common depth from the emitter 801. In some example implementations, the first group of light emitters may be active for a first mode of the emitter 801, and the second group of light emitters may be active for a second mode of the emitter 801.

Figure 9:
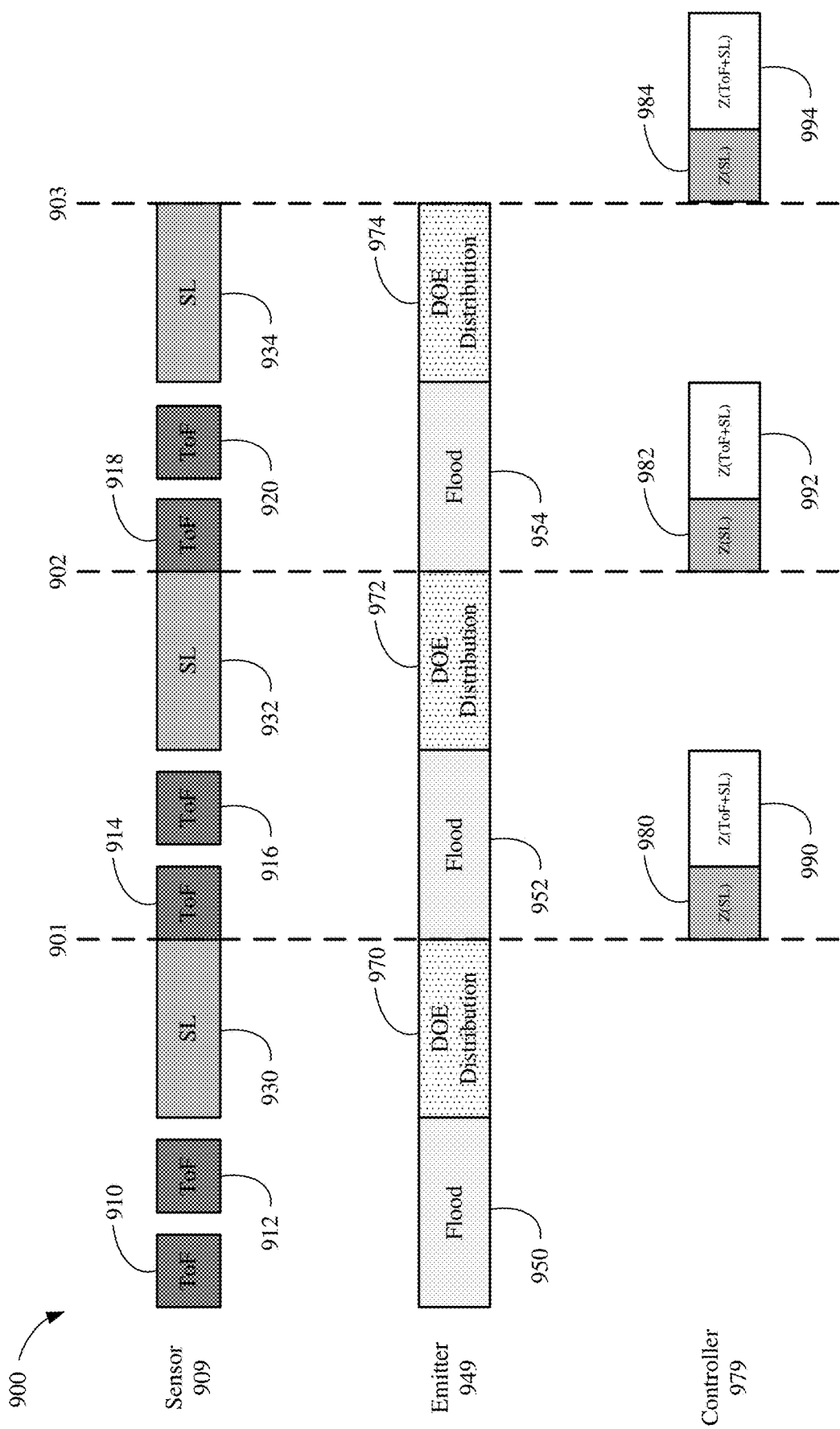
FIG. 9 shows a timing diagram illustrating example operation timings for multiple components of a ToF and SL system.

FIG. 9 shows a timing diagram 900 illustrating an example operation of a ToF and SL system including a sensor 909, an emitter 949, and a controller 979. The sensor 909, emitter 949, and controller 979 may be example embodiments of the sensor 802, emitter 801, and active depth controller 810, respectively, of FIG. 8. It will be understood that ToF and SL are example active depth techniques and that the system may use other active depth techniques in some implementations.

The example timing diagram 900 shows three projection cycles for the emitter 949: a first projection cycle ending at time 901, a second projection cycle ending at time 902, and a third projection cycle ending at time 903. The emitter 949 may project a first distribution of light during each of the projection cycles. The first distribution of light may be a flood distribution for a first projection mode, such as a ToF projection mode. For example, the emitter 949 may project a flood distribution 950, a flood distribution 952, and a flood distribution 954 during a ToF projection mode for each of the first, second, and third projection cycles, respectively. For purposes of discussion herein, a flood distribution may also be referred to as a "flood illumination" or a "diffuse light." The emitter 949 may also project a second distribution of light during each of the projection cycles. The second distribution of light may be a DOE distribution for a second projection mode, such as a SL projection mode. For example, the emitter 949 may project a DOE distribution 970, a DOE distribution 972, and a DOE distribution 974 during the SL projection mode for each of the first, second, and third projection cycles, respectively. For purposes of discussion herein, a DOE distribution may also be referred to as a "DOE pattern," a "DOE projection," a "SL distribution," a "SL pattern," and/or a "SL projection."

The example timing diagram 900 shows three sensing cycles for the sensor 909: a first sensing cycle ending at time 901, a second sensing cycle ending at time 902, and a third sensing cycle ending at time 903. The sensor 909 may read out two frames of ToF sensor data (during a ToF sensing mode) and one frame of SL sensor data (during a SL sensing mode) for each sensing cycle. The sensor 909 may be configured to operate in the ToF sensing mode at the same time as when the emitter 949 is configured to operate in the ToF projection mode. The sensor 909 may be configured to operate in the SL sensing mode at the same time as when the emitter 949 is configured to operate in the SL projection mode. Similar to the system described in FIG. 2C, during the ToF sensing mode, the sensor 909 may be exposed at a number of particular phase offsets (e.g., Phase 0°, Phase 180°, Phase 90°, and Phase 270°) relative to a pulsed signal from the emitter 949. The sensor 909 may accumulate and store an amount of charge (Q) for each of the particular phase offsets.

For example, during a first exposure, the sensor 909 may read out the first frame of ToF sensor data 910 based on a Q1 and a Q2, where Q1 is the charge accumulated at 0° phase offset, and where Q2 is the charge accumulated at 180° phase offset. During a second exposure, the sensor 909 may read out a second frame of ToF sensor data 912 based on a Q3 and a Q4, where Q3 is the charge accumulated at 90° phase offset, and where Q4 is the charge accumulated at 270° phase offset. Similarly, the sensor 909 may read-out a first frame of ToF sensor data 914 and a second frame of ToF sensor data 916 during the second sensing cycle, and the sensor 909 may read-out a first frame of ToF sensor data 918 and a second frame of ToF sensor data 920 during the third sensing cycle. The sensor 909 may read-out a frame of SL sensor data 930 during the first sensing cycle, a frame of SL sensor data 932 during the second sensing cycle, and a frame of SL sensor data 934 during the third sensing cycle.

After each sensing cycle, the controller 979 may calculate SL depth information (Z(SL)) using SL sensor data. For example, the controller 979 may calculate SL depth information (Z(SL)) 980, Z(SL) 982, and Z(SL) 984 after each of the first, second, and third sensing cycle, respectively.

After calculating Z(SL), the controller 979 may calculate ToF depth information (Z(ToF+SL)) for the corresponding sensing cycle using ToF sensor data and Z(SL). For example, the controller 979 may calculate ToF depth information Z(ToF+SL) 990, Z(ToF+SL) 992, and Z(ToF+SL) 994 after calculating each of Z(SL) 980, Z(SL) 982, and Z(SL) 984, respectively. In some aspects, the controller 979 may calculate Z(ToF+SL) using one frame of ToF sensor data for the corresponding sensing cycle, or, since ToF sensing techniques are susceptible to noise, the controller 979 may calculate Z(ToF+SL) using more than one frame of ToF sensor data for the corresponding sensing cycle. For example, to calculate Z(ToF+SL) 990, the controller 979 may average the first frame of ToF sensor data 910 with the second frame of ToF sensor data 912. The controller 979 may calculate Z(SL) and Z(ToF+SL) any time during the next sensing cycle. For example, the controller 979 may calculate Z(SL) 980 and Z(ToF+SL) 990 between time 901 and time 902.

In the example of FIG. 9, the system may generate high-resolution and high-accuracy depth information without (or with at least mitigated) MPI artifacts using the sparse depth information from the SL mode as a baseline to eliminate multipath effects from the ToF mode. In accordance with the embodiments described herein, the system may generate the depth information without (or with at least mitigated) MPI artifacts using a single sensor (e.g., the sensor 909), a single emitter (e.g., the emitter 949), and/or a single controller (e.g., the controller 979).

Figure 10A:
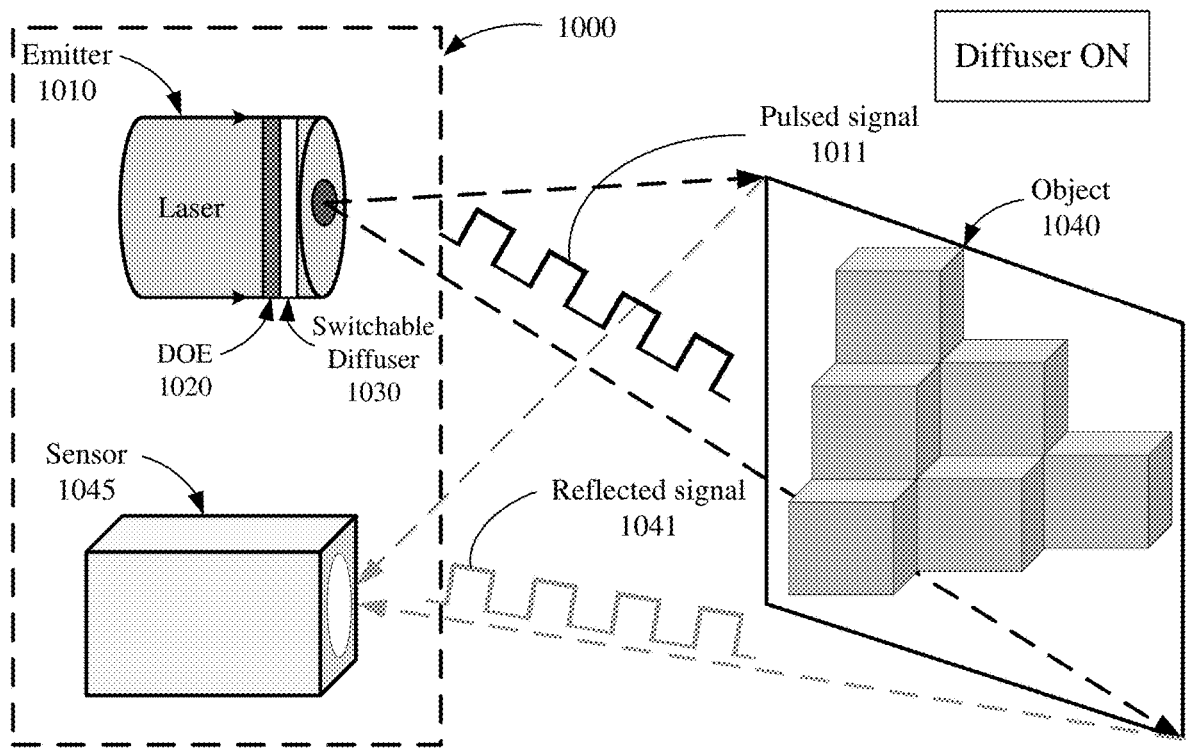
FIG. 10A shows an example ToF and SL system operating in a first mode.

FIG. 10A shows an example ToF and SL system 1000 operating in a first (e.g., ToF) mode. The system 100 includes an emitter 1010 and a sensor 1045. During the ToF mode, the emitter 1010 may operate in a ToF projection mode, and the sensor 1045 may operate in a ToF sensing mode, as described with respect to FIG. 9. The emitter 1010 and the sensor 1045 may be example embodiments of the emitter 801 and the sensor 802, respectively, of FIG. 8. The ToF and SL system 1000 includes a DOE 1020 and a diffuser 1030 coupled to the front of the DOE 1020. In some aspects, the diffuser 1030 may be a switchable diffuser, such as described above with respect to the diffuser 807 of FIG. 8. The diffuser 1030 may be switched on (e.g., for flood distribution) during the ToF projection mode. Specifically, during the ToF projection mode, the emitter 1010 may transmit pulsed signal 1011 toward an object 1040 while the diffuser 1030 diffuses the emitted light to project a flood distribution (e.g., a uniform illumination) onto the scene. A reflected signal 1041 may arrive at the sensor 1045, and the sensor 1045 may calculate ToF depth information based on an amount of time for the light to be reflected back to the sensor 1045 for each pixel.

Figure 10B:
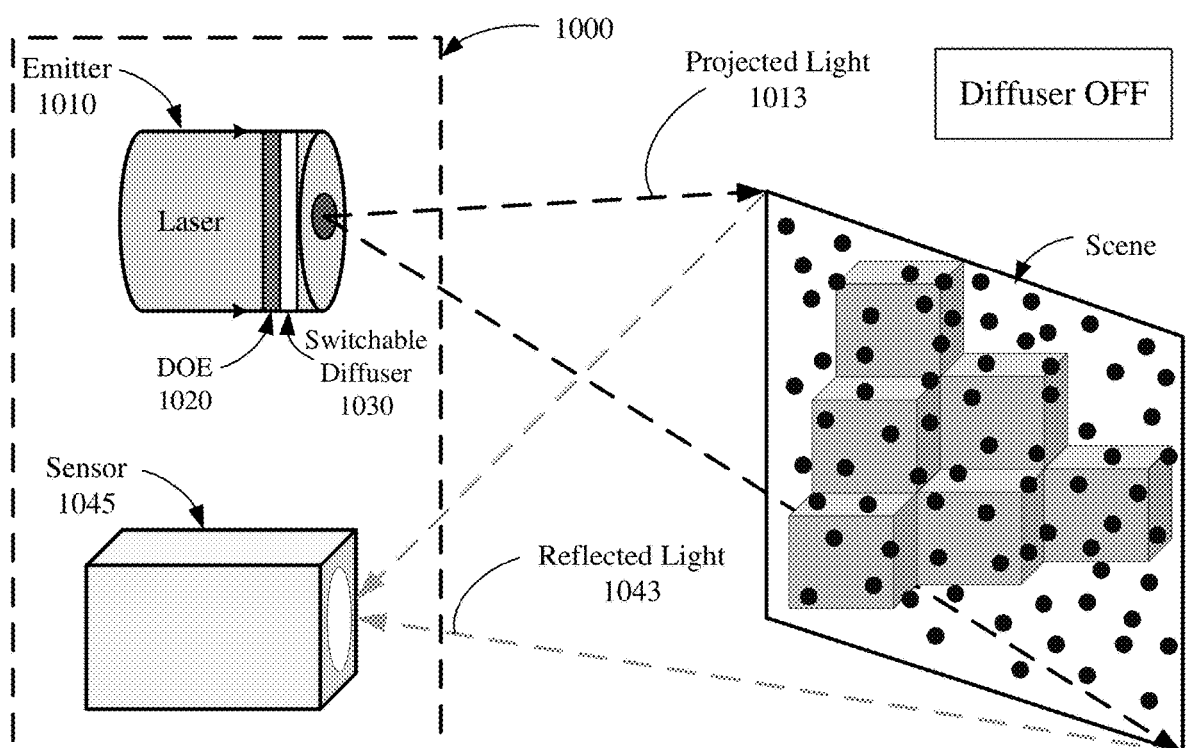
FIG. 10B shows the example ToF and SL system of FIG. 10A operating in a second mode.

FIG. 10B shows the example ToF and SL system 1000 operating in a second (e.g., SL) mode. During the SL mode, the emitter 1010 may operate in a SL projection mode, and the sensor 1045 may operate in a SL sensing mode, as described with respect to FIG. 9. The diffuser 1030 may be switched off (e.g., functioning as a transparent piece of glass) during the SL projection mode. Specifically, during the SL projection mode, the emitter 1010 may project a DOE distribution toward a scene, which will pass through the diffuser 1030 relatively unaffected (as projected light 1013), and onto the scene (e.g., as a dot matrix pattern). Reflected light 1043 may arrive at the sensor 1045, and the sensor 1045 may calculate SL depth information, Z(SL), based on how the projected light 1013 distorts on the scene. An active depth controller (such as the active depth controller 810 of FIG. 8) may use Z(SL) during a calculation of ToF depth information, Z(ToF+SL), as described with respect to FIG. 9. In this manner, the active depth controller 810 may reduce or eliminate multipath artifacts in the ToF depth information. Moreover, the present embodiments may provide accurate high-resolution depth sensing using a single sensor (e.g., the sensor 1045), a single emitter (e.g., the emitter 1010), and/or a single controller (e.g., the active depth controller 810).

Figure 11A:
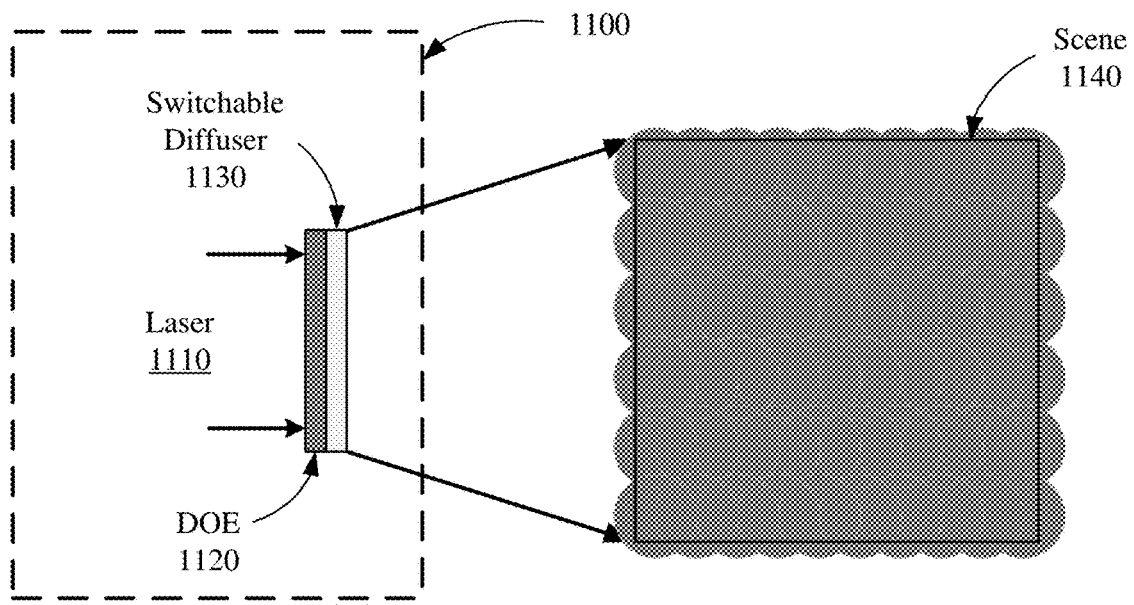
FIG. 11A is a simplified illustration of the ToF and SL system shown in FIG. 10A.

FIG. 11A is a simplified illustration of a ToF and SL system 1100 operating in a first (e.g., ToF) mode. The ToF and SL system 1100 may be an example implementation of the ToF and SL system 1000, as described with respect to FIG. 10A. The laser 1110 emits light through the DOE 1120. In the ToF mode, the diffuser 1130 may be switched on (indicated with solid gray), and the DOE distribution may be diffused when passing through the diffuser 1130, which floods the scene 1140 with illumination.

Figure 11B:
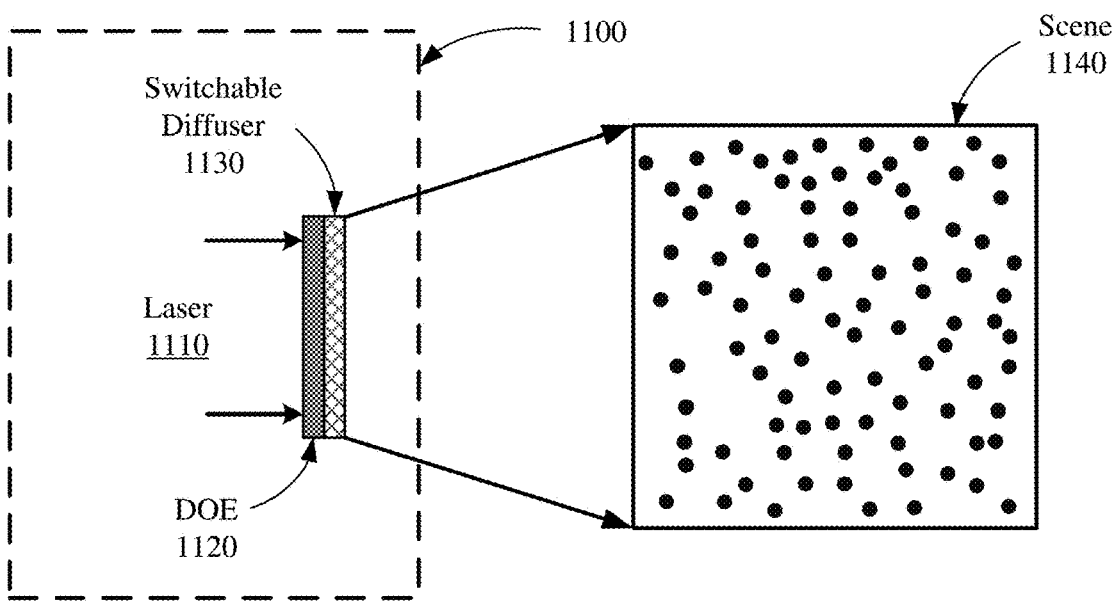
FIG. 11B is a simplified illustration of the ToF and SL system shown in FIG. 10B.

FIG. 11B is a simplified illustration of the ToF and SL system 1100 of FIG. 11A operating in a second (e.g., SL) mode. The ToF and SL system 1100 may be an example implementation of the ToF and SL system 1000, as described with respect to FIG. 10B. The laser 1110 emits light through a DOE 1120. In the SL mode, the diffuser 1130 may be switched off (indicated with a dotted pattern), and the DOE distribution may be projected through the diffuser 1130 (e.g., unaltered) and onto the scene 1140.

Figure 12A:
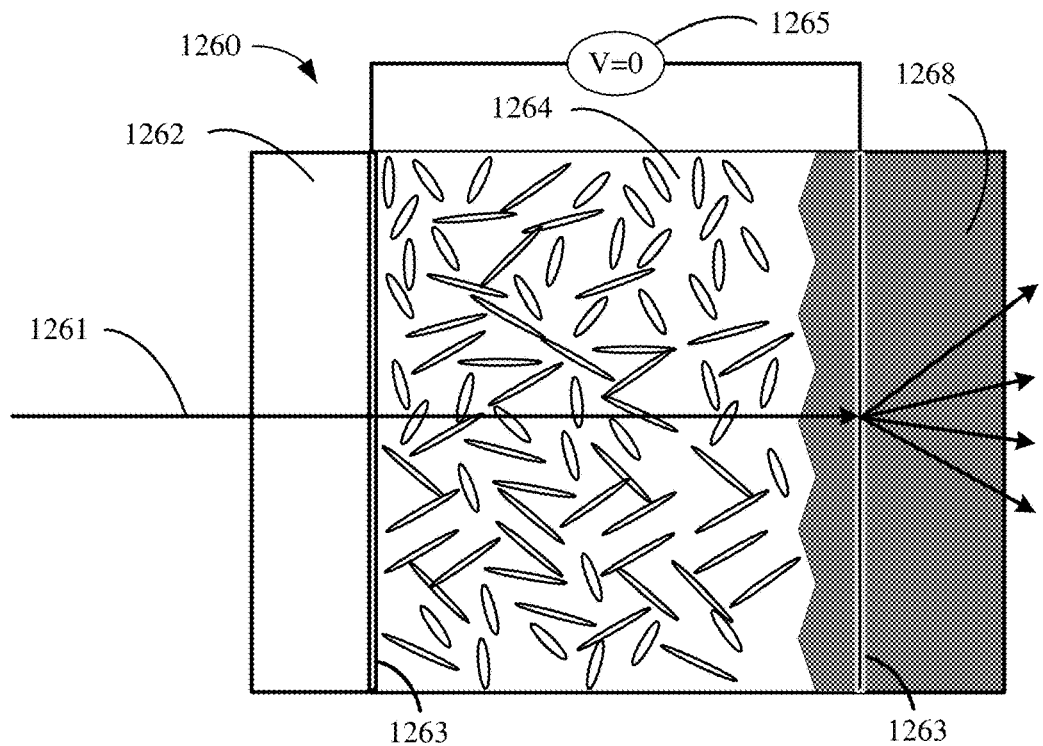
FIG. 12A shows an example switchable diffuser.

FIG. 12A shows an example switchable diffuser 1260 operating in a first (e.g., ToF) mode, in accordance with some embodiments. The switchable diffuser 1260 may be an example embodiment of the diffuser 807 of FIG. 8. In some aspects, the switchable diffuser 1260 may be a liquid crystal (LC)-based switchable diffuser. The switchable diffuser 1260 has a layer of dielectric material (e.g., a LC layer 1264) having refractive index, $$n_a = \frac{2(n_o + n_e)}{3}.$$

A glass substrate may be positioned between a DOE substrate 1262 and the LC layer 1264. In some aspects, the DOE substrate 1262 has Indium tin oxide (ITO) coding on its backside and faces a diffusion layer 1268. The diffusion layer 1268 may be fabricated in the dielectric material layer and have a refractive index, $n_o$. A pair of conductive materials 1263 with a voltage 1265 may control an orientation of the LC molecules in the LC layer 1264. In the example of FIG. 12A, a voltage is not applied across the LC layer 1264 (e.g., the voltage 1265, V=0). Thus, the refractive index of the LC material 1264 remains $n_a$, and the LC molecules in the LC layer 1264 remain randomly oriented. Since, in this example, the refractive index of the LC layer 1264 and the diffusion layer 1268 are different, the diffuser 1260 may be "switched on." Thus, the light 1261 scatters (e.g., diffuses) at the junction between the LC layer 1264 and the diffusion layer 1268, which projects a flood distribution for the ToF mode.

Figure 12B:
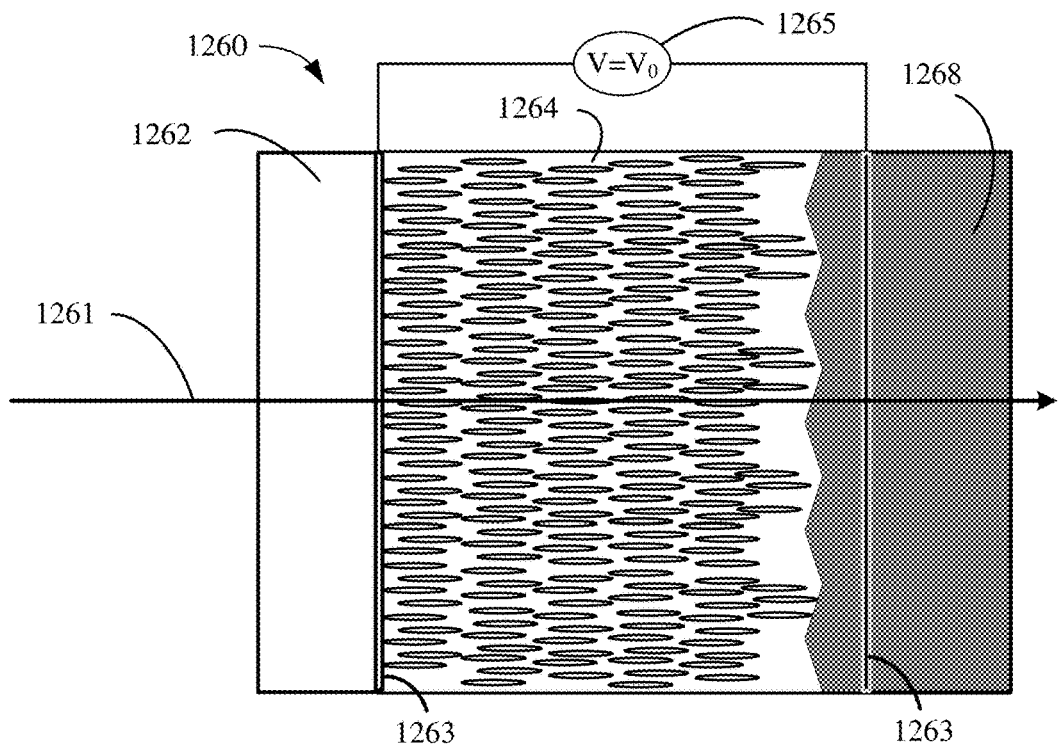
FIG. 12B shows another example switchable diffuser.

FIG. 12B shows the example switchable diffuser 1260 of FIG. 12A operating in a second (e.g., SL) mode, in accordance with some embodiments. The switchable diffuser 1260 may be an example embodiment of the diffuser 807 of FIG. 8. In the example of FIG. 12B, a voltage, $V_0$, is applied across the LC layer 1264. Thus, the refractive index of the LC material 1264 becomes $n_o$, and the LC molecules in the LC layer 1264 move into alignment. Since, in this example, the refractive index of the LC layer 1264 and the diffusion layer 1268 are the same, the diffuser 1260 may be "switched off." Thus, the light 1261 goes straight through the junction between the LC layer 1264 and the diffusion layer 1268 (e.g., relatively unaffected), which projects a DOE distribution for the SL mode.

Figure 13A:
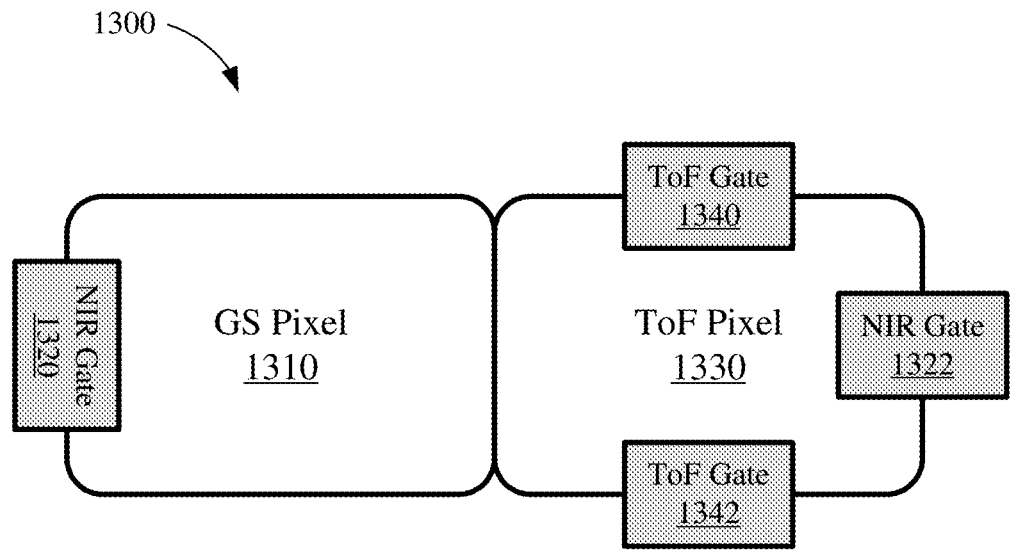
FIG. 13A shows a top-down view of an example sensor capable of operating in a ToF mode and a SL mode.

FIG. 13A shows a top-down view of an example sensor 1300 capable of operating in a first sensing mode (e.g., a ToF sensing mode) and a second sensing mode (e.g., a SL sensing mode). The sensor 1300 may be an example embodiment of the sensor 802 of FIG. 8. The sensor 1300 may also be referred to herein as a composite, hybrid, NIR, pixel image sensor or receiver and/or an integrated (photo) detector array. In some aspects, the sensor 1300 may have a monolithic CMOS architecture with a TDMR configuration for alternating between the ToF and SL sensing modes. In some other aspects, the sensor 1300 may have a charge-coupled device (CCD) architecture. The sensor 1300 may combine a Global Shutter (GS) Pixel 1310 with a ToF Pixel 1330. The sensor 1300 may be configured to switch between a ToF sensing mode and a SL sensing mode at the same time that an emitter (such as the emitter 801 of FIG. 8) switches between a ToF projection mode and a SL projection mode, as described with respect to FIG. 9.

The sensor 1300 may include one or more multi-phase, lock-in pixel cells for determining a phase difference between a pulsed signal and a received signal for the ToF sensing mode. The sensor 1300 may also include a GS demodulation pixel cell for operating the sensor 1300 in the SL sensing mode. For example, the sensor 1300 includes two total NIR gates (NIR gate 1320 and NIR gate 1322) for detecting NIR light from reflected signals. The NIR gate 1320 may detect NIR light during the SL sensing mode. Since the GS pixel 1310 and the ToF pixel 1330 are not electrically isolated, the NIR gate 1320 (in addition to the NIR gate 1322) may also detect NIR light during the ToF sensing mode. The sensor 1300 also has two ToF gates (ToF gate 1340 and ToF gate 1342) for receiving reflected light pulses having a phase shift of φ relative to the pulsed signal and converting the optical signals to electrical signals. Each ToF gate is coupled to a voltage source (not shown) that provides time-varying control signals. Each of the two ToF gates are coupled to a readout circuit (not shown) for reading out charges (Q) collected from the reflected light. The sensor 1300 is an example of a two-phase sensor, since the first ToF gate 1340 may read out a first collected charge (e.g., Q1) at a first phase shift (e.g., 0°) relative to the emitted light and the second ToF gate 1342 may read out a second collected charge (e.g., Q2) at a second phase shift (e.g., 180°) relative to the emitted light. Each readout circuitry may include some number of transistors, such as selection gates, source-followers, reset gates, select gates, or any other suitable circuitry.

In this manner, the sensor 1300 may operate as a single, two-phase sensor for a mixed-mode ToF and SL system and generate high-resolution and high-accuracy depth information without (or with at least mitigated) MPI artifacts using the sparse depth information from the SL mode as a baseline to eliminate multipath effects from the ToF mode.

Figure 13B:
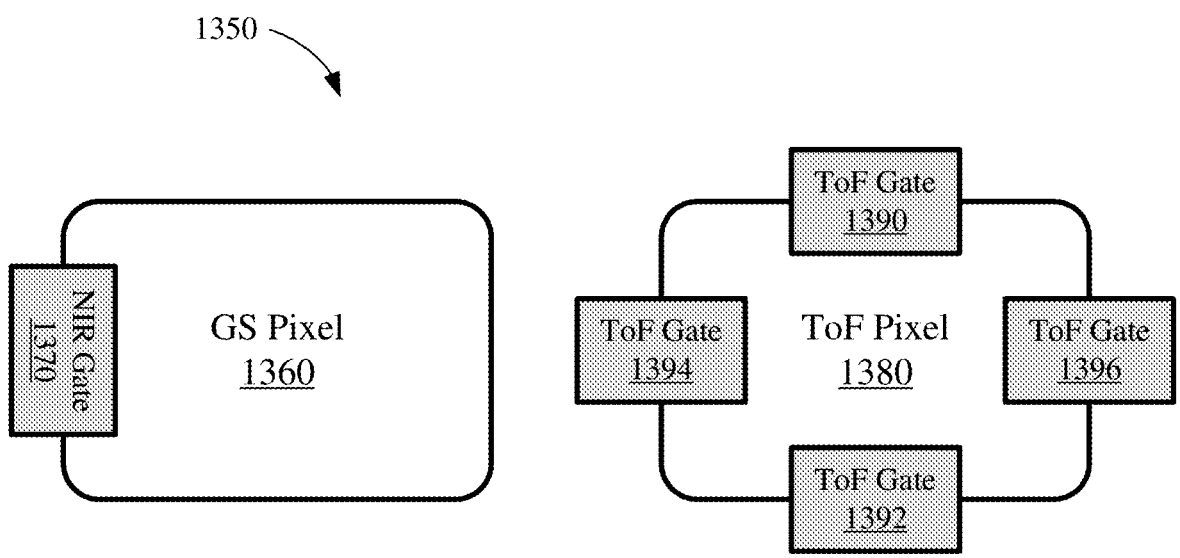
FIG. 13B shows a top-down view of another example sensor capable of operating in a ToF mode and a SL mode.

FIG. 13B shows a top-down view of an example sensor 1350 capable of operating in a first sensing mode (e.g., a ToF sensing mode) and a second sensing mode (e.g., a SL sensing mode). The sensor 1350 may be an example embodiment of the sensor 802 of FIG. 8. The sensor 1350 may also be referred to herein as a composite, hybrid, NIR, pixel image sensor or receiver and/or an integrated (photo) detector array. In some aspects, the sensor 1350 may have a monolithic CMOS architecture with a TDMR configuration for alternating between the ToF and SL sensing modes. In some other aspects, the sensor 1350 may have a CCD architecture. The sensor 1350 may combine features from a GS Pixel 1360 and a ToF Pixel 1380. The sensor 1350 may be configured to switch between a ToF sensing mode and a SL sensing mode at the same time that an emitter (such as the emitter 801 of FIG. 8) switches between a ToF projection mode and a SL projection mode, as described with respect to FIG. 9.

The sensor 1350 may include one or more multi-phase, lock-in pixel cells for determining a phase difference between a pulsed signal and a received signal for the ToF sensing mode. The sensor 1350 may also include a GS demodulation pixel cell for operating the sensor 1350 in the SL sensing mode. For example, the sensor 1350 includes a NIR gate 1370, coupled to the GS pixel 1360, for detecting NIR light from reflected signals. The NIR gate 1370 may detect NIR light during the SL sensing mode. The GS pixel 1360 and the ToF pixel 1380 are electrically isolated. Thus, unlike the ToF pixel 1330 of FIG. 13A, the GS pixel 1360 may not share the NIR gate 1370 with the ToF pixel 1380 during the ToF mode. Instead, the ToF pixel 1380 has four ToF gates (ToF gate 1390, ToF gate 1392, ToF gate 1394, and ToF gate 1396) for receiving reflected light pulses having a phase shift of φ relative to the pulsed signal and converting the optical signals to electrical signals. Each ToF gate is coupled to a voltage source (not shown) that provides time-varying control signals. Each of the four ToF gates are coupled to a readout circuit (not shown) for reading out charges (Q) collected from the reflected light. The sensor 1350 is an example of a four-phase sensor, since the first ToF gate 1390 may read out a first collected charge (e.g., Q1) at a first phase shift (e.g., 0°) relative to the emitted light, the second ToF gate 1392 may read out a second collected charge (e.g., Q2) at a second phase shift (e.g., 180°) relative to the emitted light, the third ToF gate 1394 may read out a third collected charge (e.g., Q3) at a third phase shift (e.g., 90°) relative to the emitted light, and the fourth ToF gate 1396 may read out a fourth collected charge (e.g., Q4) at a fourth phase shift (e.g., 270°) relative to the emitted light. Each readout circuitry may include some number of transistors, such as selection gates, source-followers, reset gates, select gates, or any other suitable circuitry.

In this manner, the sensor 1350 may operate as a single, four-phase sensor for a mixed-mode ToF and SL system and generate high-resolution and high-accuracy depth information without (or with at least mitigated) MPI artifacts using the sparse depth information from the SL mode as a baseline to eliminate multipath effects from the ToF mode.

Figure 14:
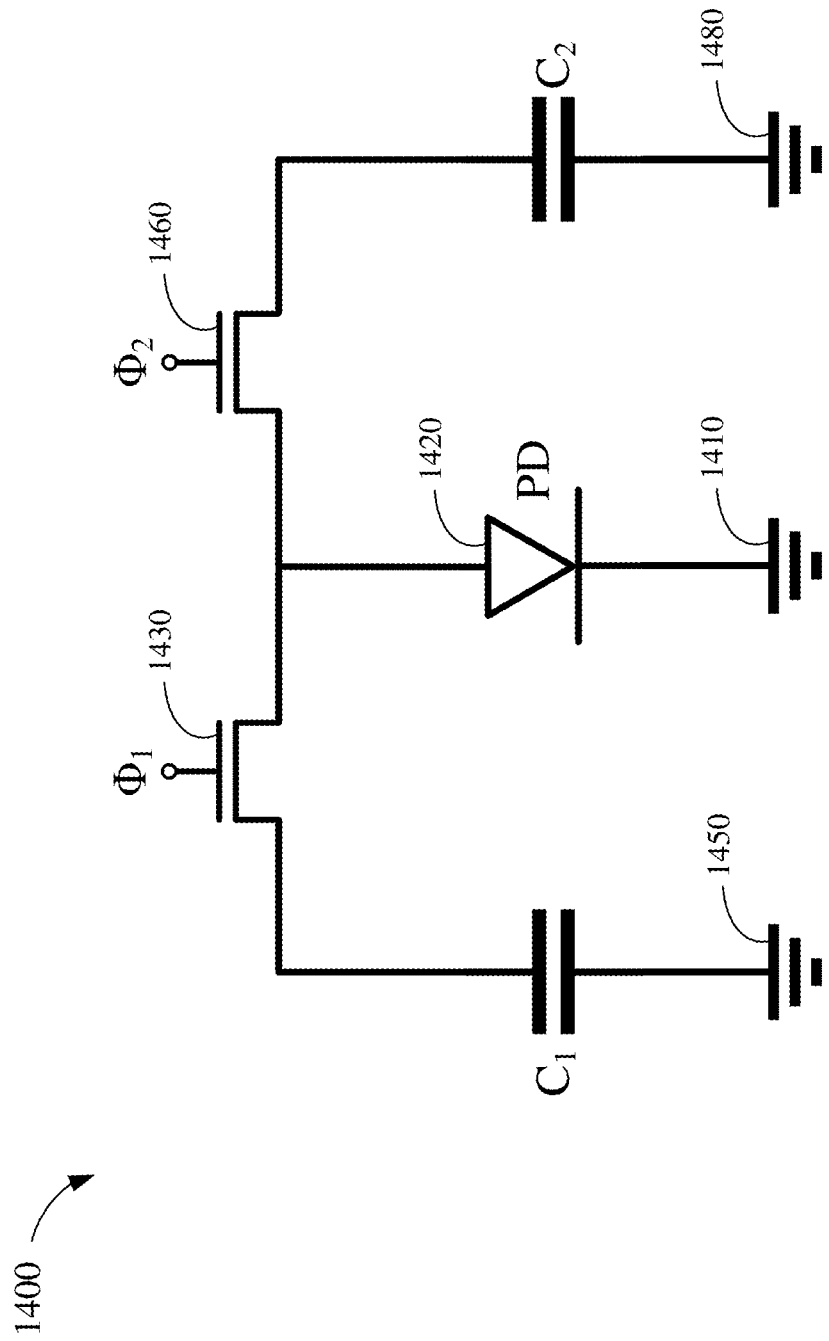
FIG. 14 shows an example electrical circuit diagram for a demodulation pixel cell.

FIG. 14 shows an example electrical circuit diagram for a demodulation pixel cell 1400. The demodulation pixel cell 1400 may include a photodiode 1420 coupled to a ground potential 1410. The photodiode 1420 may convert light (e.g., photons) from reflected signals to electrical current, which flows to a transistor 1430 and a transistor 1460 coupled in parallel to the photodiode 1420. The transistor 1430 and the transistor 1460 may block the current from flowing to a capacitor (C1) and a capacitor (C2), respectively. C1 may be coupled to a ground potential 1450, and C2 may be coupled to a ground potential 1480. In some aspects, at least one of the transistor 1430 or the transistor 1460 may be field-effect transistors (FETs). In some aspects, at least one of the transistor 1430 and the transistor 1460 may be metal-oxide-semiconductor field-effect transistors (MOSFETs).

The demodulation pixel cell 1400 may capture ToF sensor data which may be used for generating ToF depth information. For example, during a first exposure cycle, C1 may store a first charge (Q1) from a reflected signal when the shutter is opened at a first phase offset (e.g., $\Phi_1=0°$) relative to the transmitted signal, and C2 may store a second charge (Q2) from the reflected signal when the shutter is opened at a second phase offset (e.g., $\Phi_2=180°$) relative to the transmitted signal. During a second exposure cycle, C1 may store a third charge (Q3) from the reflected signal when the shutter is opened at a third phase offset (e.g., $\Phi_1=90°$) relative to the transmitted signal, and C2 may store a fourth charge (Q4) from the reflected signal when the shutter is opened at a fourth phase offset (e.g., $\Phi_2=270°$) relative to the transmitted signal. The phase offset, φ, between the transmitted signal and the reflected signal may be calculated based on the charges stored across C1 and C2 for each of the exposure cycles, which allows calculation of corresponding ToF depth information:

$$D = \frac{c * \Delta t}{2} = \frac{c * \theta}{2\omega} = \frac{c * \varphi}{4\pi * f_{mod}}$$

$$\sigma_{depth} \equiv \frac{1}{\sqrt{2} * SNR} * \frac{1}{2\pi} * \frac{c}{2 * f_{mod}}$$

$$\varphi = \tan^{-1}\left(\frac{V_{90} - V_{270}}{V_0 - V_{180}}\right) = \frac{\pi}{2} * \left(1 - \frac{V_0 - V_{180}}{|V_0 - V_{180}| + |V_{90} - V_{270}|}\right)$$

where D represents depth information, c is the speed of light $$\left(\text{i.e., } 3 * 10^8 \frac{m}{\sec}\right),$$

$f_{mod}$ represents the modulation frequency of the transmitted signal, $V_0$–$V_{180}$ represents the integrated electrical signals for $\Phi_1$ and $\Phi_2$ during the first exposure cycle, $V_{90}$–$V_{270}$ represents the integrated electrical signals for $\Phi_1$ and $\Phi_2$ during the second exposure cycle, and $\sigma_{depth}$ represents a depth accuracy.

Figure 15A:
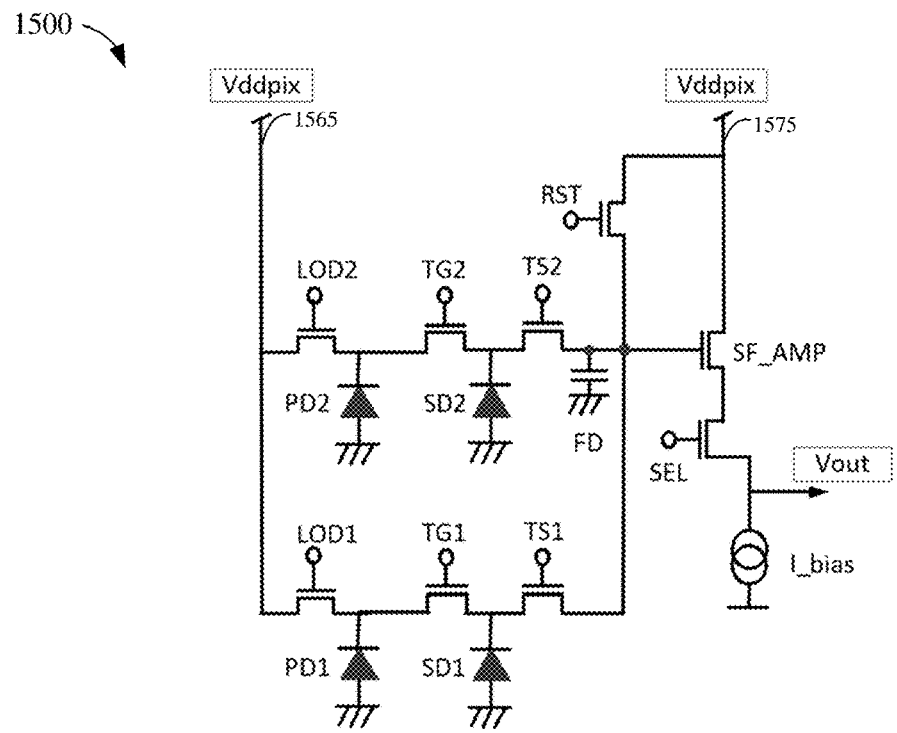
FIG. 15A shows an example electrical circuit diagram for a global shutter (GS) pixel array.

FIG. 15A shows an example electrical circuit diagram for a GS pixel array 1500. The GS pixel array 1500 may also be referred to herein as an NIR GS imager. The GS pixel array 1500 includes two shared GS photodiodes, PD1 and PD2. Each of PD1 and PD2 may absorb photons (e.g., from light reflected back from a scene and/or an object) during a SL sensing mode. Each of PD1 and PD2 is coupled to a floating storage diode, SD1 and SD2, respectively. SD1 and SD2 may operate as storage node elements for charge accumulation and readout from the photodiodes PD1 and PD2. Each of the storage diodes SD1 and the SD2 is coupled to a transfer gate, TG1 and TG2, respectively. TG1 and TG2 may be transistors with relatively low voltage drops. Charge from PD1 and PD2 may flow to a transistor LOD1 and a transistor LOD2, respectively, which are each coupled to a supply voltage, Vddpix 1565.

The GS pixel array 1500 includes a capacitor FD for accumulating charge. The capacitor FD is coupled to a transistor TS1, which is coupled to, for example, the storage diode SD1. The capacitor FD is also coupled to a transistor TS2, which is coupled to, for example, the storage diode SD2. The capacitor FD is further coupled to a reset switch, RST. When RST is closed, charge may flow to Vddpix 1575. When RST is open, charge may flow to a source follower amplifier, SF_AMP. Because the source voltage of SF_AMP remains proportional to the gate voltage, SF_AMP may convert charge to voltage and toggle a Select switch, SEL. When SEL is open (e.g., during a SL mode, when TS1 and TS2 are open), Vddpix 1575 may be isolated, and a relatively small amount of charge from each of a series of signal pulses (e.g., a pulse train) may accumulate across the capacitor FD. When SEL is closed (e.g., after each of the SL modes, when TS1 and TS2 are closed), the series of accumulated signal pulses may be transferred from each of TG1 and TG2 to an output terminal, Vout. Vout may be coupled to a current source, I_bias. Accordingly, the GS pixel array 1500 may capture SL sensor data for generating SL depth information.

Figure 15B:
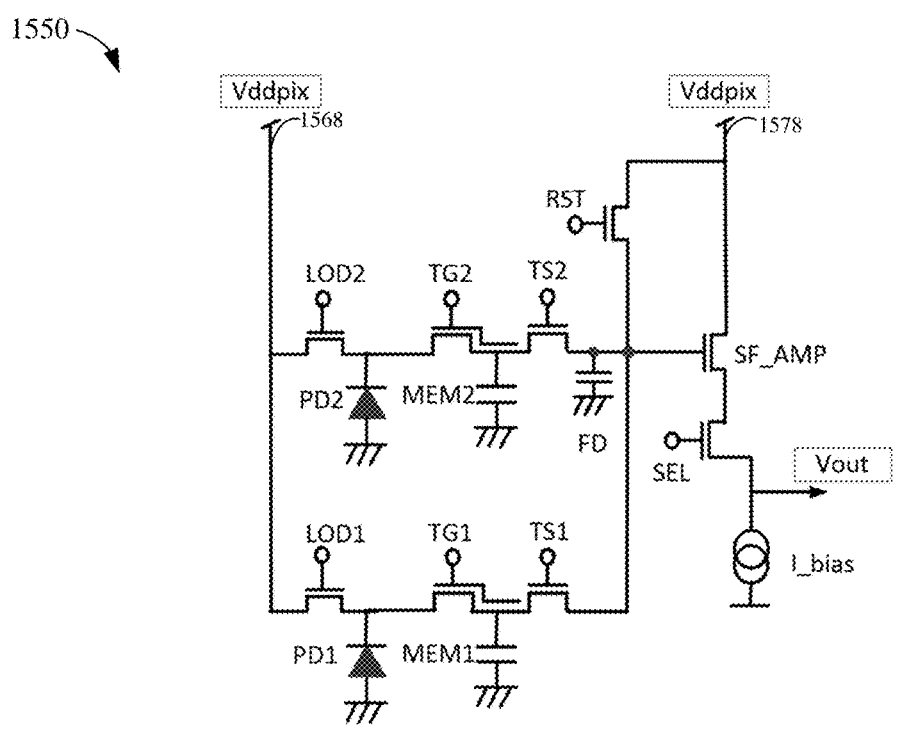
FIG. 15B shows another example electrical circuit diagram for a GS pixel array.

FIG. 15B shows an example electrical circuit diagram for a GS pixel array 1550. The GS pixel array 1550 may also be referred to herein as an NIR GS imager. The GS pixel array 1500 includes two shared GS photodiodes, PD1 and PD2. Each of PD1 and PD2 may absorb photons (e.g., from light reflected back from a scene and/or an object) during a SL sensing mode. Each of PD1 and PD2 is coupled to a CCD-readout memory, MEM1 and MEM2, respectively. MEM1 and MEM2 may operate as storage node elements for charge accumulation and readout from the photodiodes PD1 and PD2. Each of MEM1 and MEM2 is coupled to a transfer gate, TG1 and TG2, respectively. TG1 and TG2 may be transistors with relatively low voltage drops. Charge from PD1 and PD2 may flow to a transistor LOD1 and a transistor LOD2, respectively, which are each coupled to a supply voltage, Vddpix 1568.

The GS pixel array 1550 includes a capacitor FD for accumulating charge. The capacitor FD is coupled to a transistor TS1, which is coupled to, for example, the CCD-readout memory, MEM1. The capacitor FD is also coupled to a transistor TS2, which is coupled to, for example, the CCD-readout memory, MEM2. The capacitor FD is further coupled to a reset switch, RST. When RST is closed, charge may flow to Vddpix 1578. When RST is open, charge may flow to a source follower amplifier, SF_AMP. Because the source voltage of SF_AMP remains proportional to the gate voltage, SF_AMP may convert charge to voltage and toggle a Select switch, SEL. When SEL is open (e.g., during a SL mode, when TS1 and TS2 are open), Vddpix 1578 may be isolated, and a relatively small amount of charge from each of a series of signal pulses (e.g., a pulse train) may accumulate across the capacitor FD. When SEL is closed (e.g., after each of the SL modes, when TS1 and TS2 are closed), the series of accumulated signal pulses may be transferred from each of TG1 and TG2 to an output terminal, Vout. Vout may be coupled to a current source, I_bias. Accordingly, the GS pixel array 1550 may capture SL sensor data for generating SL depth information.

Figure 16A:
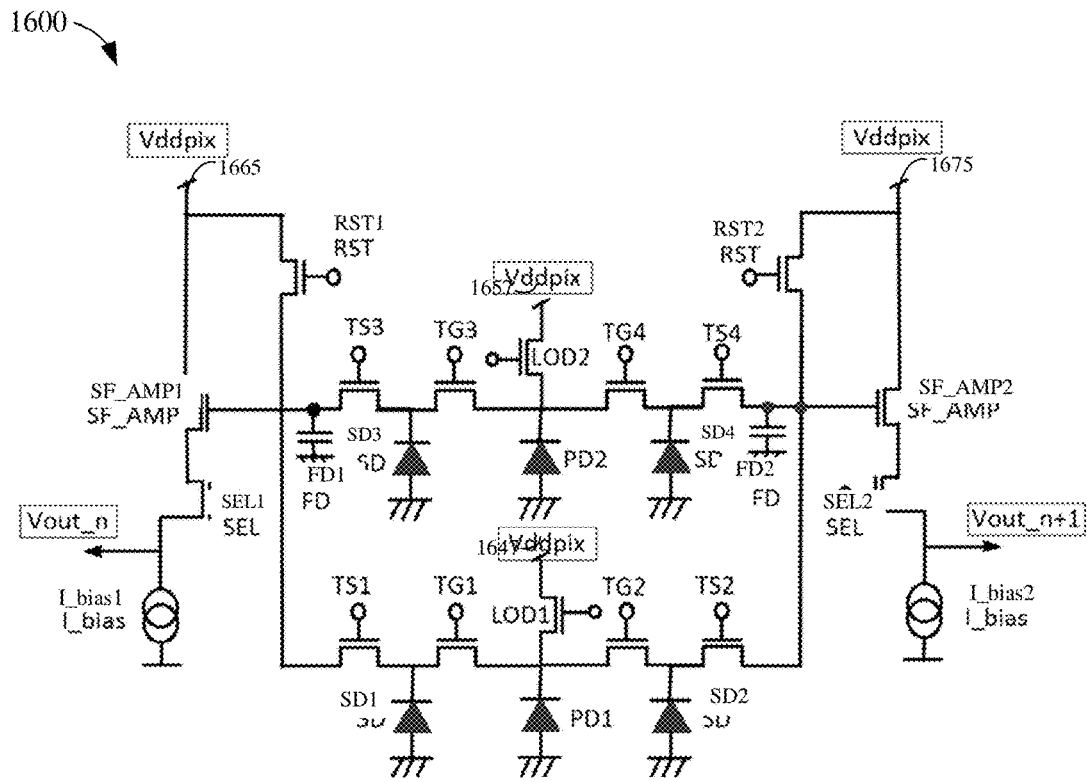
FIG. 16A shows an example electrical circuit diagram for a hybrid ToF and SL pixel array operating in a GS implementation.

FIG. 16A shows an example electrical circuit diagram for a GS pixel array 1600. The pixel array 1600 may also be referred to herein as a hybrid NIR GS imager and may be capable of operating in a ToF sensing mode and a SL sensing mode. The GS pixel array 1600 may be an example embodiment of the sensor 802 of FIG. 8. The GS pixel array 1600 includes two shared GS photodiodes, PD1 and PD2. Each of PD1 and PD2 may absorb photons (e.g., from light reflected back from a scene and/or an object) during a SL sensing mode. PD1 is coupled to two floating storage diodes, SD1 and SD2, which may operate as storage node elements for charge accumulation and readout from PD1. PD2 is coupled to two floating storage diodes, SD3 and SD4, which may operate as storage node elements for charge accumulation and readout from PD2. Each of SD1-SD4 is coupled to a transfer gate, TG1-TG4, respectively. Each of TG1-TG4 may be a transistor with a relatively low voltage drop. Charge from PD1 may flow to a transistor LOD1, which is coupled to a supply voltage, Vddpix 1647. Charge from PD2 may flow to a transistor LOD2, which is coupled to a supply voltage, Vddpix 1657.

The GS pixel array 1600 includes capacitors FD1 and FD2 for accumulating charge from reflected signals. FD1 is coupled to transistors TS1 and TS3, which are coupled to SD1 and SD3, respectively. FD2 is coupled to transistors TS2 and TS4, which are coupled to SD2 and SD4, respectively. Each of FD1 and FD2 is coupled to a reset switch, RST1 and RS2, respectively. When either of RST1 and RS2 is closed, charge may flow to Vddpix 1665 and Vddpix 1675, respectively. When either of RST1 and RST2 is open, charge may flow to a source follower amplifier, SF_AMP1 and SF_AMP2, respectively. Because the source voltage of SF_AMP1 and SF_AMP2 remains proportional to the gate voltage, SF_AMP1 and SF_AMP2 may convert charge to voltage and toggle a corresponding Select switch, SEL1 and SEL2, respectively.

During the ToF sensing mode, each of TS2, TG2, TS3, TG3, TS1, TG1, TS4, and TG4 may be closed (activated) and the pixel array 1600 may demodulate multiple phases of reflected signals. SEL1 and SEL2 may also be open during the ToF sensing mode, which may isolate Vddpix 1665 and Vddpix 1675, allowing a relatively small amount of charge from each of a series of signal pulses (e.g., a pulse train) to accumulate across FD1 and FD2. When SEL1 and SEL2 are closed, the series of accumulated signal pulses may be transferred from TG1 and TG4 to output terminals, Vout_n and Vout_n+1, respectively. Vout_n may be coupled to a current source, I_bias1, and Vout_n+1 may be coupled to a current source, I_bias2. Accordingly, the GS pixel array 1600 may capture SL sensor data for generating SL depth information. During the ToF sensing mode, a laser of an emitter (such as the emitter 801 of FIG. 8) may operate with a relatively narrow duty cycle and turn on for a relatively short amount of time for each pulse. Thus, eye safety may be increased and power consumption may be reduced as compared with a rolling shutter (RS) pixel array (not pictured).

During the SL sensing mode, each of TS2, TG2, TS3, and TG3 (e.g., half of the read-out circuitry) may be open, and each of TS1, TG1, TS4, and TG4 (e.g., the other half of the read-out circuitry) may be closed. In this manner, reflected signals may be captured in dual-phase (e.g., one on the left, and one on the right) at different time frames. SEL1 and SEL2 may also be open during the SL sensing mode, which may isolate Vddpix 1665 and Vddpix 1675, allowing a relatively small amount of charge from each of a series of signal pulses (e.g., a pulse train) to accumulate across FD1 and FD2. When SEL1 and SEL2 are closed, the series of accumulated signal pulses may be transferred from TG1 and TG4 to output terminals, Vout_n and Vout_n+1, respectively. Vout_n may be coupled to a current source, I_bias1, and Vout_n+1 may be coupled to a current source, I_bias2. Accordingly, the GS pixel array 1600 may capture SL sensor data for generating SL depth information.

In this manner, the pixel array 1600 may operate as a hybrid GS sensor for a mixed-mode ToF and SL system for generating high-resolution and high-accuracy depth information without (or with at least mitigated) MPI artifacts using the sparse depth information from the SL mode as a baseline to eliminate multipath effects from the ToF mode.

Figure 16B:
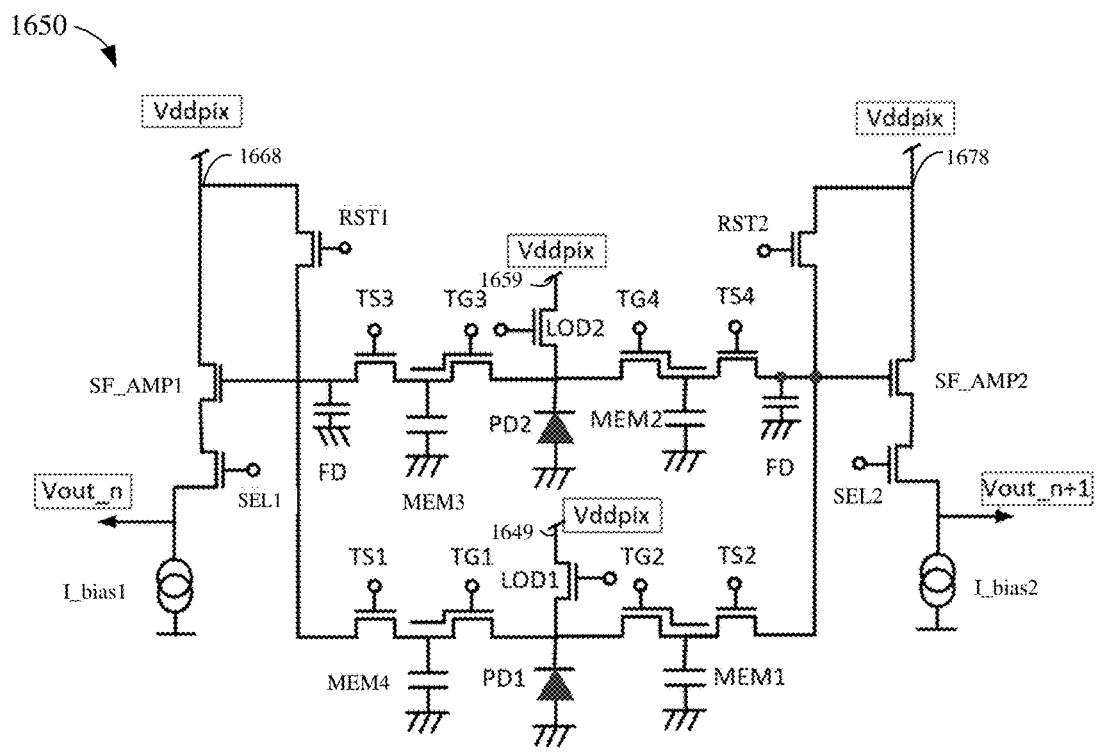
FIG. 16B shows another example electrical circuit diagram for a hybrid ToF and SL pixel array operating in a GS implementation.

FIG. 16B shows an example electrical circuit diagram for a GS pixel array 1650. The pixel array 1650 may also be referred to herein as a hybrid NIR GS imager and may be capable of operating in a ToF sensing mode and a SL sensing mode. The GS pixel array 1650 may be an example embodiment of the sensor 802 of FIG. 8. The GS pixel array 1650 includes two shared GS photodiodes, PD1 and PD2. Each of PD1 and PD2 may absorb photons (e.g., from light reflected back from a scene and/or an object) during a SL sensing mode. PD1 is coupled to two CCD-readout memories, MEM1 and MEM4, which may operate as storage node elements for charge accumulation and readout from PD1. PD2 is coupled to two CCD-readout memories, MEM2 and MEM3, which may operate as storage node elements for charge accumulation and readout from PD2. Each of MEM1-MEM4 is coupled to a transfer gate, TG1-TG4, respectively. Each of TG1-TG4 may be a transistor with a relatively low voltage drop. Charge from PD1 may flow to a transistor LOD1, which is coupled to a supply voltage, Vddpix 1647. Charge from PD2 may flow to a transistor LOD2, which is coupled to a supply voltage, Vddpix 1657.

The GS pixel array 1650 includes capacitors FD1 and FD2 for accumulating charge from reflected signals. FD1 is coupled to transistors TS1 and TS3, which are coupled to MEM1 and MEM3, respectively. FD2 is coupled to transistors TS2 and TS4, which are coupled to MEM2 and MEM4, respectively. Each of FD1 and FD2 is coupled to a reset switch, RST1 and RS2, respectively. When either of RST1 and RS2 is closed, charge may flow to Vddpix 1665 and Vddpix 1675, respectively. When either of RST1 and RST2 is open, charge may flow to a source follower amplifier, SF_AMP1 and SF_AMP2, respectively. Because the source voltage of SF_AMP1 and SF_AMP2 remains proportional to the gate voltage, SF_AMP1 and SF_AMP2 may convert charge to voltage and toggle a corresponding Select switch, SEL1 and SEL2, respectively.

During the ToF sensing mode, each of TS2, TG2, TS3, TG3, TS1, TG1, TS4, and TG4 may be closed (activated) and the pixel array 1650 may demodulate multiple phases of reflected signals. SEL1 and SEL2 may also be open during the ToF sensing mode, which may isolate Vddpix 1665 and Vddpix 1675, allowing a relatively small amount of charge from each of a series of signal pulses (e.g., a pulse train) to accumulate across FD1 and FD2. When SEL1 and SEL2 are closed, the series of accumulated signal pulses may be transferred from TG1 and TG4 to output terminals, Vout_n and Vout_n+1, respectively. Vout_n may be coupled to a current source, I_bias1, and Vout_n+1 may be coupled to a current source, I_bias2. Accordingly, the GS pixel array 1650 may capture SL sensor data for generating SL depth information. During the ToF sensing mode, a laser of an emitter (such as the emitter 801 of FIG. 8) may operate with a relatively narrow duty cycle and turn on for a relatively short amount of time for each pulse. Thus, eye safety may be increased and power consumption may be reduced as compared with a RS pixel array (not pictured).

During the SL sensing mode, each of TS2, TG2, TS3, and TG3 (e.g., half of the read-out circuitry) may be open, and each of TS1, TG1, TS4, and TG4 (e.g., the other half of the read-out circuitry) may be closed. In this manner, reflected signals may be captured in dual-phase (e.g., one on the left, and one on the right) at different time frames. SEL1 and SEL2 may also be open during the SL sensing mode, which may isolate Vddpix 1665 and Vddpix 1675, allowing a relatively small amount of charge from each of a series of signal pulses (e.g., a pulse train) to accumulate across FD1 and FD2. When SEL1 and SEL2 are closed, the series of accumulated signal pulses may be transferred from TG1 and TG4 to output terminals, Vout_n and Vout_n+1, respectively. Vout_n may be coupled to a current source, I_bias1, and Vout_n+1 may be coupled to a current source, I_bias2. Accordingly, the GS pixel array 1650 may capture SL sensor data for generating SL depth information.

In this manner, the pixel array 1650 may operate as a hybrid GS sensor for a mixed-mode ToF and SL system for generating high-resolution and high-accuracy depth information without (or with at least mitigated) MPI artifacts using the sparse depth information from the SL mode as a baseline to eliminate multipath effects from the ToF mode.

Figure 17:
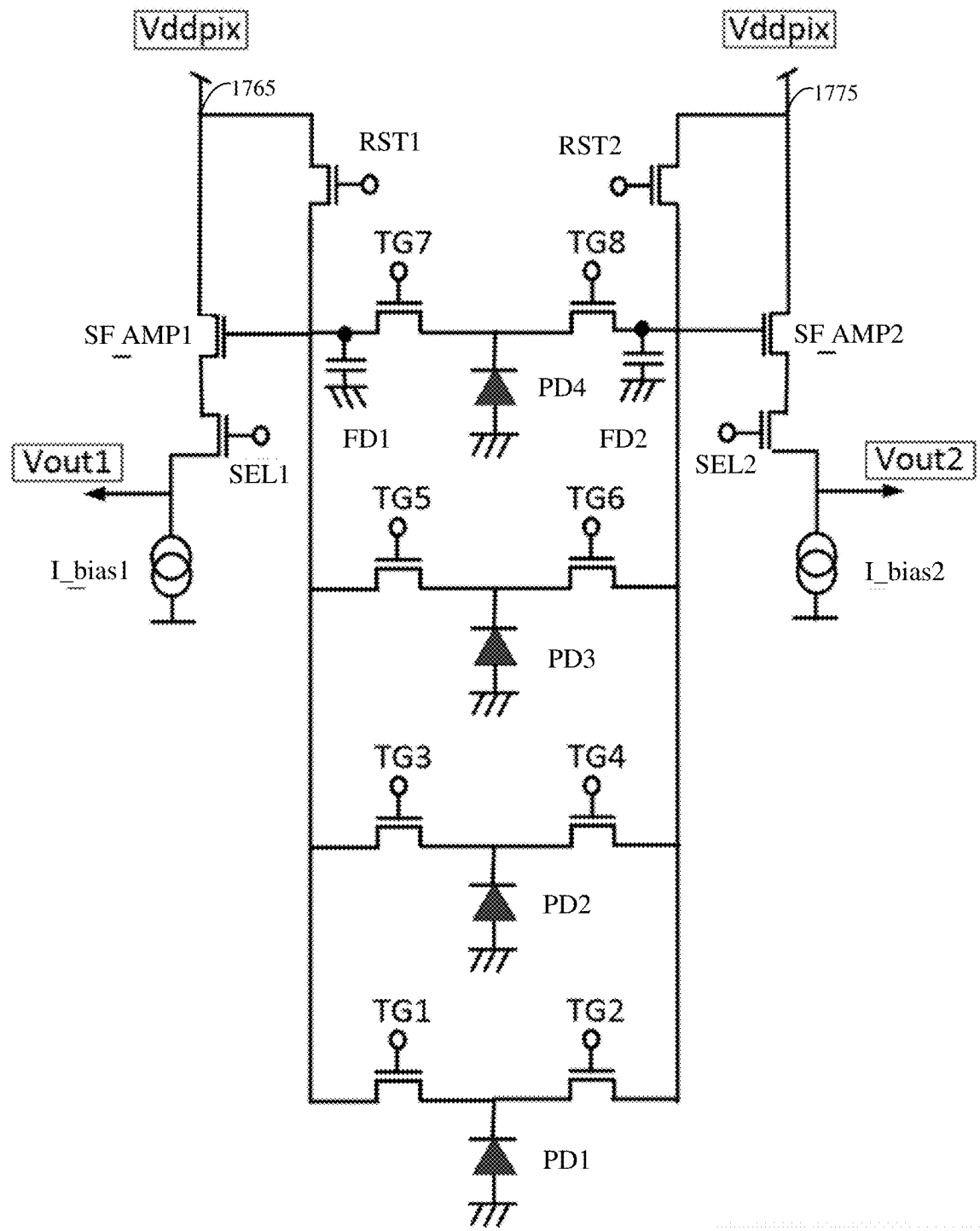
FIG. 17 shows an example electrical circuit diagram for a hybrid ToF and SL pixel array operating in a rolling shutter (RS) implementation.

FIG. 17 shows an example electrical circuit diagram for a RS pixel array 1700. The pixel array 1700 may also be referred to herein as a hybrid NIR RS imager and may be capable of operating in a ToF sensing mode and a SL sensing mode. The RS pixel array 1700 may be an example embodiment of the sensor 802 of FIG. 8. The pixel array 1700 may be configured to read-out signal line-by-line and thus, to operate in a constant wave mode (e.g., at a particular duty cycle) so as to expose each line of the RS for an equal amount of time. The RS pixel array 1700 includes four shared RS photodiodes, PD1-PD4. Each of PD1-PD4 may absorb photons (e.g., from light reflected back from a scene and/or an object) during a SL sensing mode. PD1 is coupled to two transfer gates, TG1 and TG2. PD2 is coupled to two transfer gates, TG3 and TG4. PD3 is coupled to two transfer gates, TG5 and TG6. PD4 is coupled to two transfer gates, TG7 and TG8. Each of TG1-TG8 may be a transistor with a relatively low voltage drop.

The RS pixel array 1700 includes capacitors FD1 and FD2 for accumulating charge from reflected signals. Each of FD1 and FD2 is coupled to a reset switch, RST1 and RS2, respectively. When either of RST1 and RS2 is closed, charge may flow to Vddpix 1765 and Vddpix 1775, respectively. When either of RST1 and RST2 is open, charge may flow to a source follower amplifier, SF_AMP1 and SF_AMP2, respectively. Because the source voltage of SF_AMP1 and SF_AMP2 remains proportional to the gate voltage, SF_AMP1 and SF_AMP2 may convert charge to voltage and toggle a corresponding Select switch, SEL1 and SEL2, respectively.

During the ToF sensing mode, each of TG1-TG8 may be closed (activated) and the pixel array 1700 may demodulate multiple phases of reflected signals. SEL1 and SEL2 may be open during the ToF sensing mode, which may isolate Vddpix 1765 and Vddpix 1775, allowing a relatively small amount of charge from each of a series of signal pulses (e.g., a pulse train) to accumulate across FD1 and FD2. When SEL1 is closed, a series of accumulated signal pulses may be transferred from TG1, TG3, TG5, and TG7 to output terminal, Vout1. When SEL2 is closed, a series of accumulated signal pulses may be transferred from TG2, TG4, TG6, and TG8 to output terminal, Vout2. Vout1 may be coupled to a current source, I_bias1, and Vout2 may be coupled to a current source, I_bias2. Accordingly, the RS pixel array 1700 may capture ToF sensor data for generating ToF depth information.

During the SL sensing mode, each of TG1, TG4, TG5, and TG8 (e.g., half of the read-out circuitry) may be closed, and each of TG2, TG3, TG6, and TG7 (e.g., the other half of the read-out circuitry) may be open. In this manner, reflected signals may be captured in dual-phase (e.g., one on the left, and one on the right) at different time frames. SEL1 and SEL2 may also be open during the SL sensing mode, which may isolate Vddpix 1765 and Vddpix 1775, allowing a relatively small amount of charge from each of a series of signal pulses (e.g., a pulse train) to accumulate across FD1 and FD2.

In this manner, the pixel array 1700 may operate as a hybrid RS sensor for a mixed-mode ToF and SL system for generating high-resolution and high-accuracy depth information without (or with at least mitigated) MPI artifacts using the sparse depth information from the SL mode as a baseline to eliminate multipath effects from the ToF mode.

Figure 18:
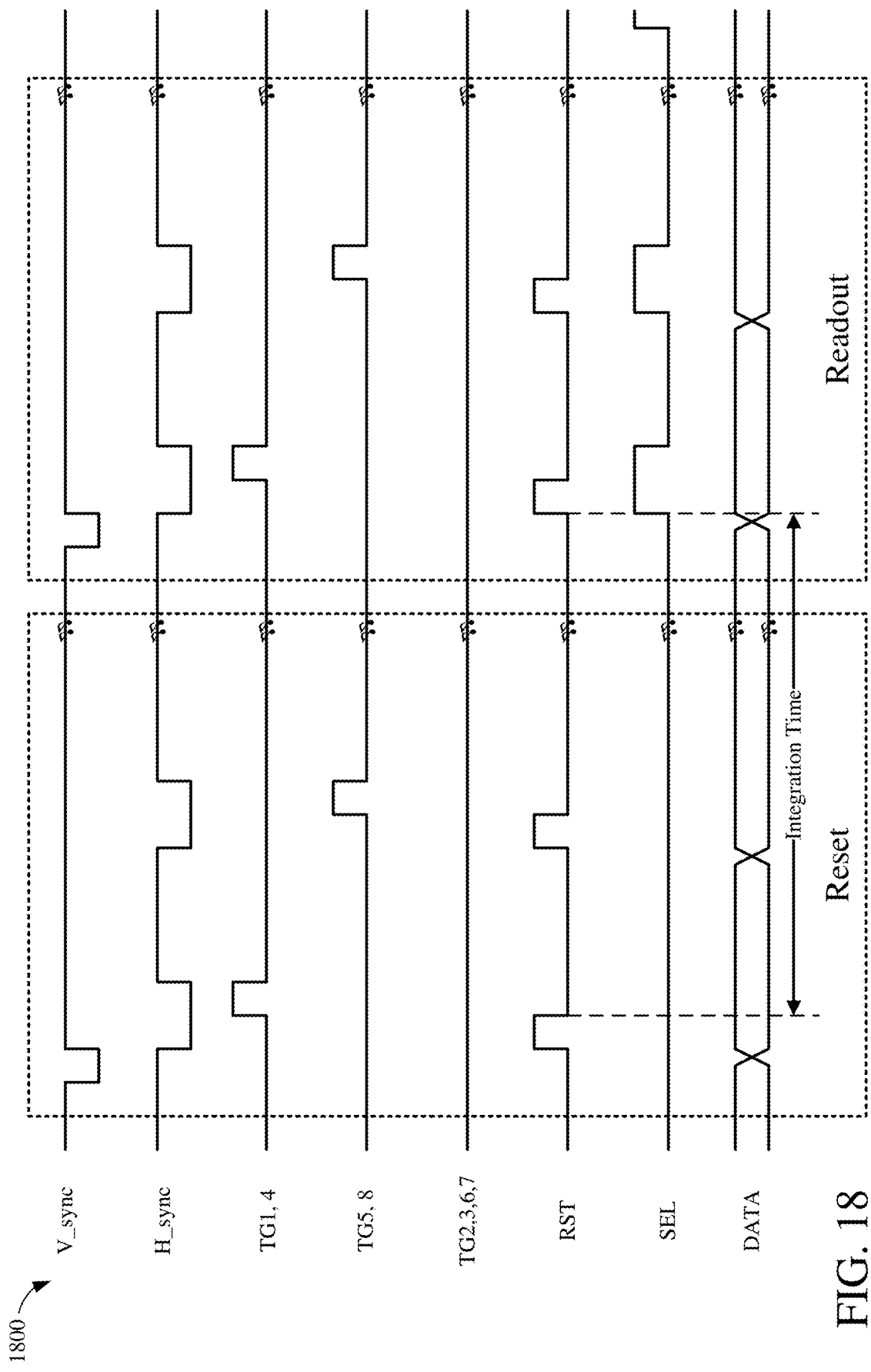
FIG. 18 shows an example timing diagram illustrating a hybrid ToF and SL pixel array of a device with a RS implementation operating in a SL mode.

FIG. 18 shows an example timing diagram 1800 depicting an RS sensor operating in a SL mode. The RS sensor may be an example embodiment of the ToF and SL pixel array 1700 of FIG. 17. With reference to FIG. 17, for example, the pixel array 1700 may utilize only half of the transfer gates (TGs) (e.g., TG1, TG4, TG5, and TG8) when operating in the SL mode. The signal for TG1 and TG4 may activate during every other (e.g., n) first horizontal sync (H_sync) period (e.g., which immediately follows the vertical sync (V_sync) period) for each of the Reset and Readout periods during the SL mode. The signal for TG5 and TG8 may activate during the other (e.g., n+1) horizontal sync (H_sync) periods for each of the Reset and Readout periods during the SL mode. That is, each of TG2, TG3, TG6, and TG7 may remain deactivated while operating in the SL mode. Activation timing for the RST and SEL switches during the SL mode are also shown in FIG. 18. The integration time shows the period during which charge is accumulated at the RS sensor, as described with respect to FIG. 17. The RS sensor may alternate reading out SL data (e.g., SL depth information) and ToF data (e.g., ToF depth information).

Figure 19:
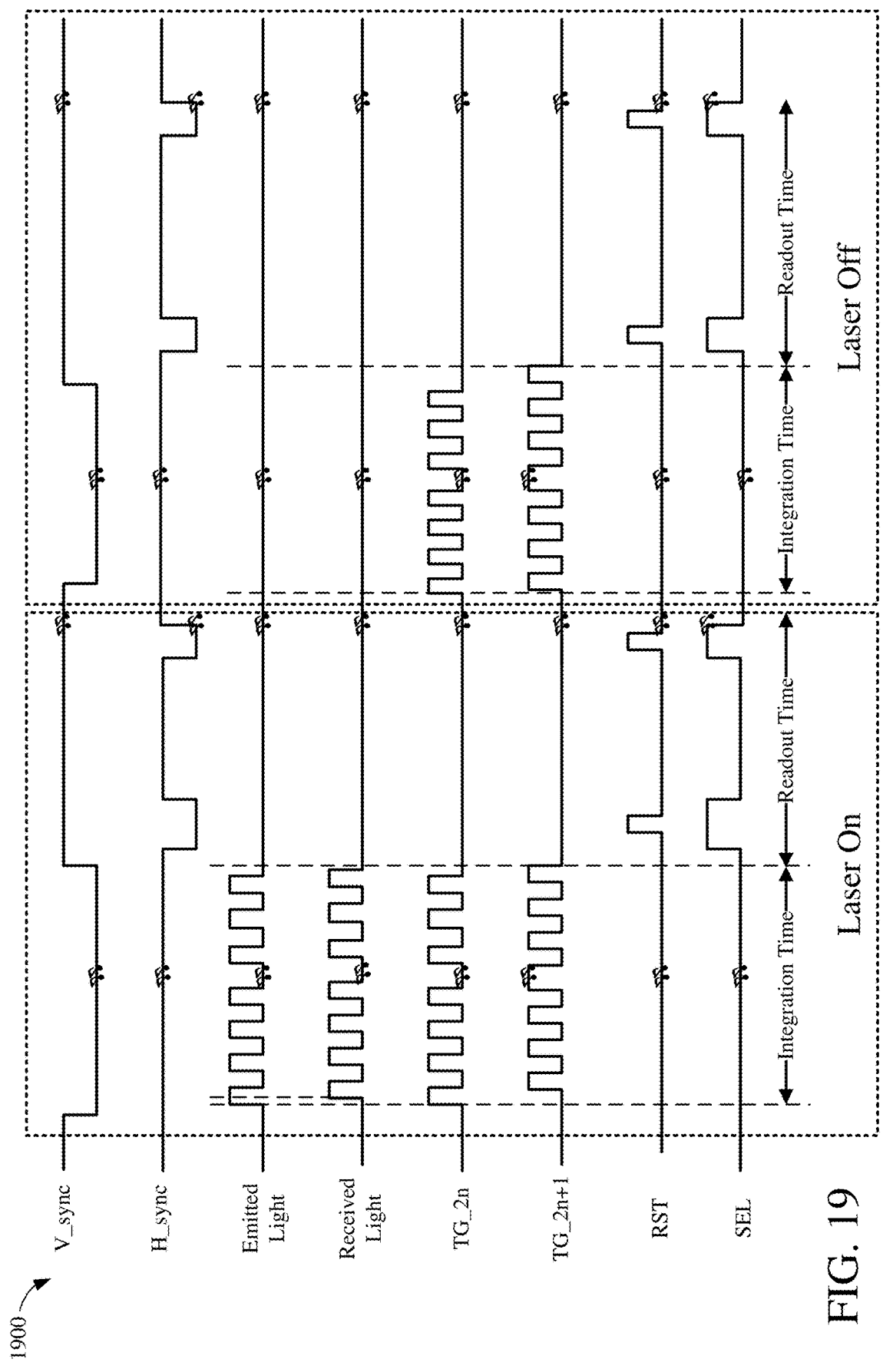
FIG. 19 shows an example timing diagram illustrating a hybrid ToF and SL pixel array of a device with a RS implementation operating in a ToF mode.

FIG. 19 shows an example timing diagram 1900 depicting an RS sensor operating in a ToF mode. The RS sensor may be an example embodiment of the ToF and SL pixel array 1700 of FIG. 17. With reference to FIG. 17, for example, the pixel array 1700 may utilize all of the transfer gates (TGs) (e.g., TG1-TG8) when operating in the ToF mode. The signal for TG1, TG3, TG5, and TG7 may activate (while TG2, TG4, TG6, and TG8 are deactivated) during every other (e.g., 2n+1) first horizontal sync (H_sync) period, which may be referred to herein as an out-of-phase raw signal, or $S_{180}$. The signal for TG2, TG4, TG6, and TG8 may activate (while TG1, TG3, TG5, and TG7 are deactivated) during the other (e.g., 2n) horizontal sync (H_sync) periods, which may be referred to herein as an in-phase raw signal, or $S_0$. Activation timing for the RST and SEL switches during the SL mode are also shown in FIG. 19. The integration time shows the period during which charge from the reflected signals is accumulated at the RS sensor, as described with respect to FIG. 17. A readout operation period follows each integration period. During each readout period, the FD nodes (e.g., FD 1730 and FD 1767 of FIG. 17) operate as storage nodes, and the TG gates are deactivated (or "turned off"), allowing for the sensor to extract the accumulated charge before resetting the FD nodes for the next exposure cycle. In an aspect, the RS sensor may compensate (or "cancel") background light (e.g., ambient light or noise) by capturing an additional frame while an emitter (such as the emitter 801 of FIG. 8) is deactivated. Accordingly, the RS sensor may subtract a relatively dark onset signal from the phases of raw signals (e.g., $S_0$ and $S_{180}$) when generating depth information.

Figure 20:
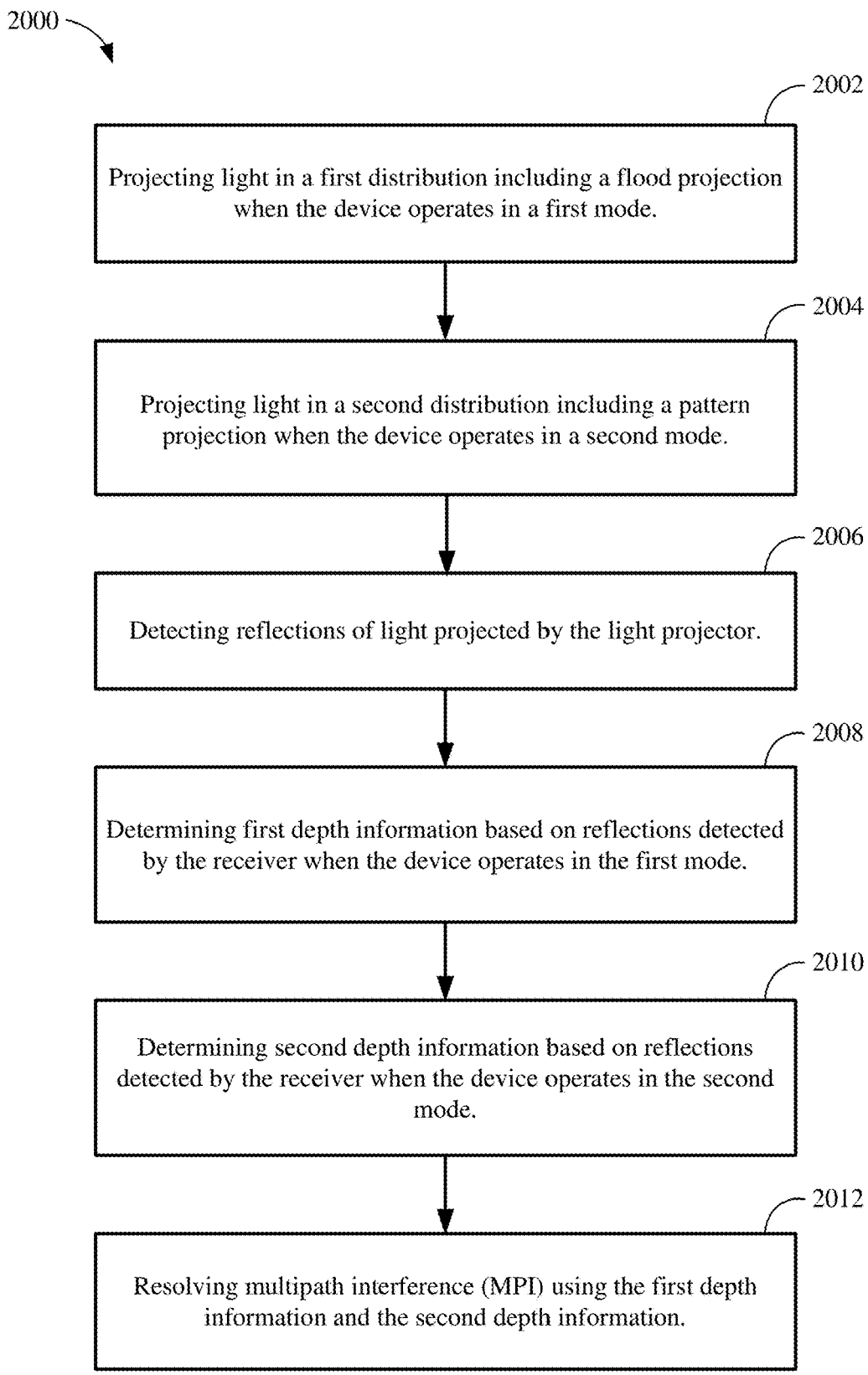
FIG. 20 shows a flowchart illustrating an example process for depth sensing according to some implementations.

FIG. 20 shows a flowchart illustrating an example process 2000 for depth sensing according to some implementations. The process 2000 may be performed by a device such as the device 800 described above with reference to FIG. 8. In some implementations, the process 2000 begins in block 2002 with projecting light in a first distribution including a flood projection when the device operates in a first mode. In block 2004, the process 2000 proceeds with projecting light in a second distribution including a pattern projection when the device operates in a second mode. In block 2006, the process 2000 proceeds with detecting reflections of light projected by the light projector. In block 2008, the process 2000 proceeds with determining first depth information based on reflections detected by the receiver when the device operates in the first mode. In block 2010, the process 2000 proceeds with determining second depth information based on reflections detected by the receiver when the device operates in the second mode. In block 2012, the process 2000 proceeds with resolving MPI using the first depth information and the second depth information. In some implementations, the pattern projection may be created by a DOE disposed between the switchable diffuser and a light source of a light projector. In some implementations, the device may be a wireless communication device.

Figure 21A:
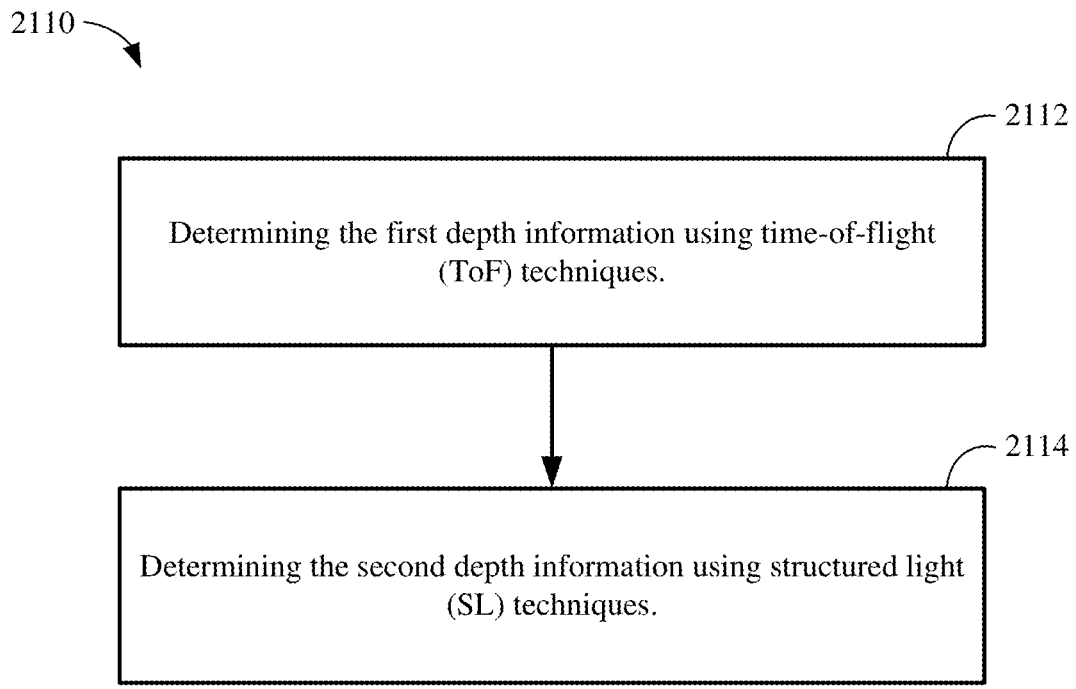
FIG. 21A shows a flowchart illustrating an example process for depth sensing according to some implementations.

FIG. 21A shows a flowchart illustrating an example process 2110 for depth sensing according to some implementations. The process 2110 may be performed by a device such as the device 800 described above with reference to FIG. 8. In some implementations, the process 2110 may be an example of the processes of block 2008 and block 2010 of FIG. 20 for determining the first depth information and determining the second depth information, respectively. The process 2110 begins in block 2112 with determining the first depth information using ToF techniques. In block 2114, the process 2110 proceeds with determining the second depth information using SL techniques.

Figure 21B:
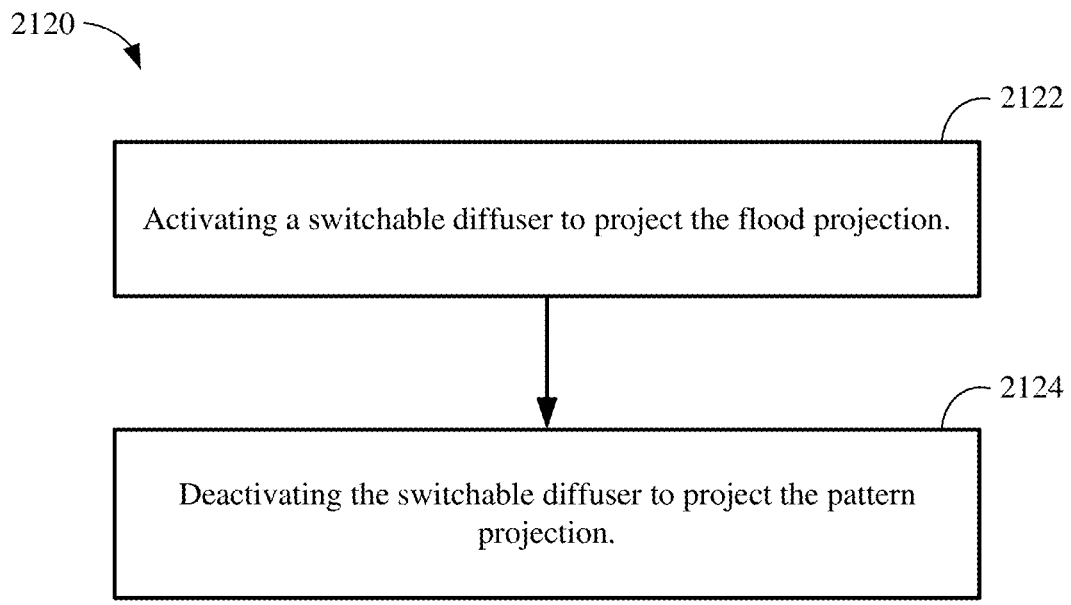
FIG. 21B shows a flowchart illustrating an example process for depth sensing according to some implementations.

FIG. 21B shows a flowchart illustrating an example process 2120 for depth sensing according to some implementations. The process 2120 may be performed by a device such as the device 800 described above with reference to FIG. 8. In some implementations, the process 2120 may be an example of the processes of block 2002 and block 2004 of FIG. 20 for projecting light, and begins in block 2122 with activating a switchable diffuser to project the flood projection. In block 2124, the process 2120 proceeds with deactivating the switchable diffuser to project the pattern projection.

In some implementations, the light projector may be a birefringent material disposed between the DOE and the switchable diffuser for applying a voltage across a refractive material. The switchable diffuser may have a first refractive index and the birefringent material may be a liquid crystal material having a second refractive index. In some aspects, the first refractive index and the second refractive index may be different when the light projector does not apply the voltage across the refractive material. In some aspects, the first refractive index and the second refractive index may be the same when the light projector does apply the voltage across the refractive material. In some aspects, the light projector may not apply the voltage across the refractive material when the device operates in the first mode. In some aspects, the light projector may apply the voltage across the refractive material when the device operates in the second mode.

Figure 21C:
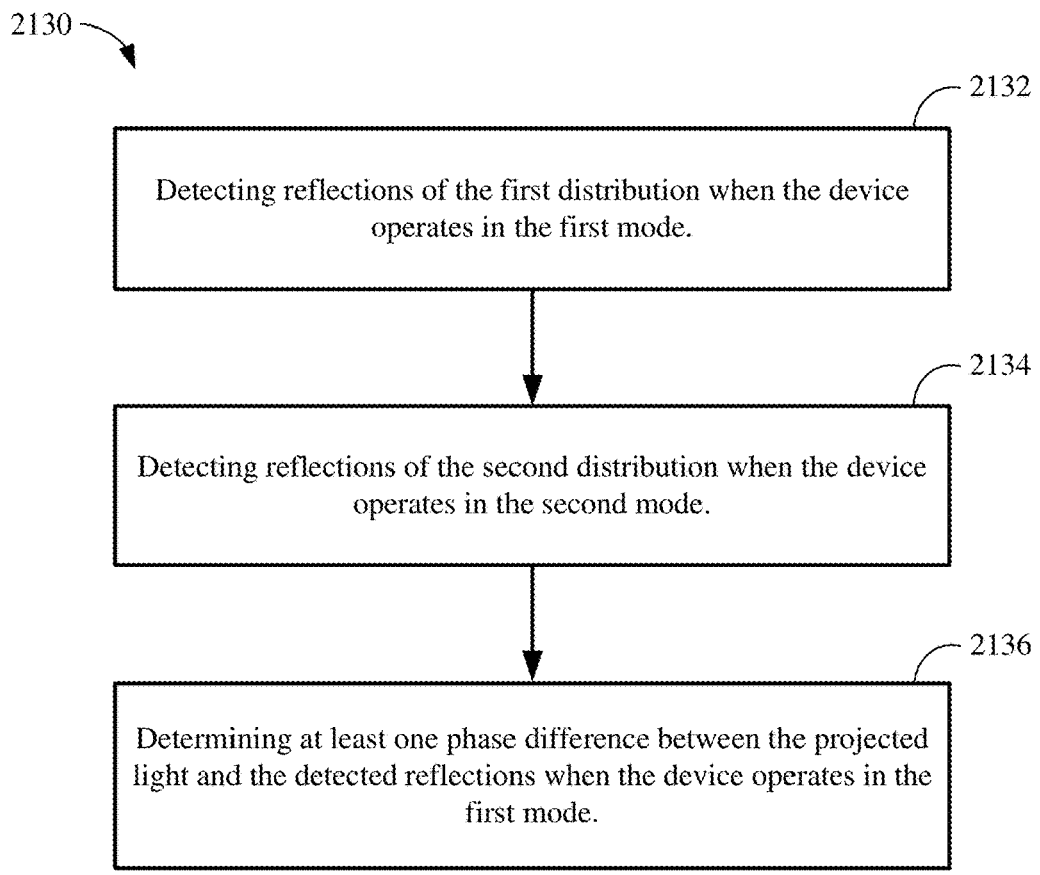
FIG. 21C shows a flowchart illustrating an example process for depth sensing according to some implementations.

FIG. 21C shows a flowchart illustrating an example process 2130 for depth sensing according to some implementations. The process 2130 may be performed by a device such as the device 800 described above with reference to FIG. 8. In some implementations, the process 2130 may be an example of the process of block 2006 of FIG. 20 for detecting reflections of light projected by the light projector, and begins in block 2132 with detecting reflections of the first distribution when the device operates in the first mode. In block 2134, the process 2130 proceeds with detecting reflections of the second distribution when the device operates in the second mode. In block 2136, the process 2130 proceeds with determining at least one phase difference between the projected light and the detected reflections when the device operates in the first mode.

In some implementations, a monolithic pixel sensor including at least one GS pixel cell and at least one lock-in pixel cell may determine the at least one phase difference in block 2136. In some aspects, the receiver may detect, via the at least one GS pixel cell, NIR light based on the reflections detected by the receiver when the device operates in the second mode. In some aspects, the lock-in pixel cell may include two ToF gates for operating in a two-phase mode. In some aspects, the at least one GS pixel cell and the at least one lock-in pixel cell may be isolated and the lock-in pixel cell may include four ToF gates for operating in a four-phase mode.

Figure 21D:
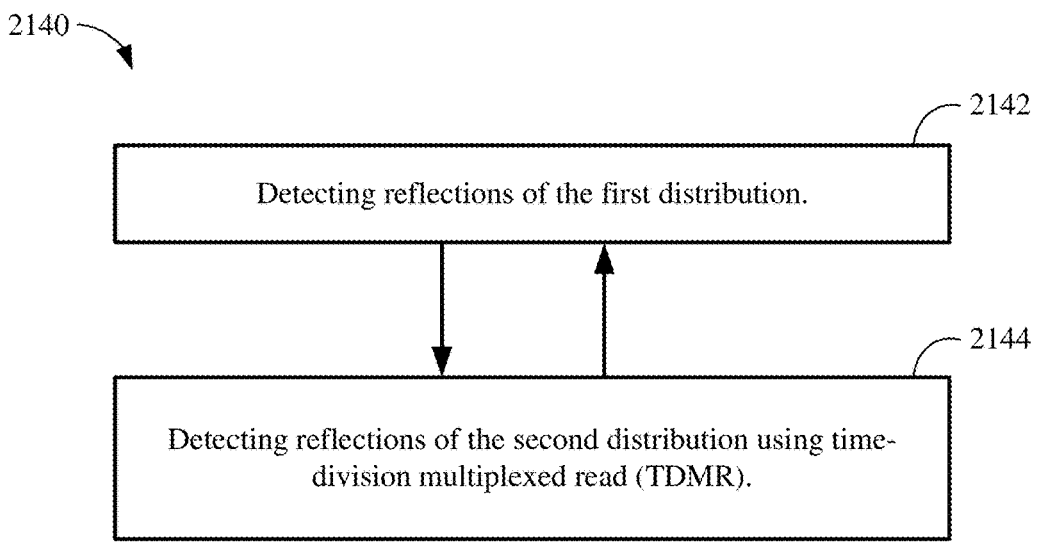
FIG. 21D shows a flowchart illustrating an example process for depth sensing according to some implementations.

FIG. 21D shows a flowchart illustrating an example process 2140 for depth sensing according to some implementations. The process 2140 may be performed by a device such as the device 800 described above with reference to FIG. 8. The process 2140 may alternate between block 2142 (detecting reflections of the first distribution) and block 2144 (detecting reflections of the second distribution using TDMR). In some implementations, block 2142 may be an example of block 2132 of FIG. 21C for detecting reflections of the first distribution. In some implementations, block 2144 may be an example of block 2134 of FIG. 21C for detecting reflections of the second distribution. In some implementations, a CMOS device and a CCD may alternate the detecting in process 2140.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium (such as the memory 806 in the device 800 of FIG. 8) including instructions 808 that, when executed by the processor 804 (or the active depth controller 810), cause the device 800 to perform one or more of the methods described above. The non-transitory processor-readable data storage medium may form part of a computer program product, which may include packaging materials.

The non-transitory processor-readable storage medium may include random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors, such as the processor 804 or the active depth controller 810 in the device 800 of FIG. 8. Such processor(s) may include but are not limited to one or more digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structures or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

While the present disclosure shows illustrative aspects, it should be noted that various changes and modifications could be made herein without departing from the scope of the appended claims. For example, while the projectors are illustrated as including a lens to direct light toward a diffractive element, a projector may not include a lens or may include multiple lenses. In another example, the electricity applied by the device or light projector in adjusting the projection may be alternating current (AC) or direct current (DC), and the voltage may be constant or non-constant. The electricity therefore may be any suitable electricity for adjusting the projection. Additionally, the functions, steps or actions of the method claims in accordance with aspects described herein need not be performed in any particular order unless expressly stated otherwise. For example, the steps of the described example operations, if performed by the device 800, the active depth controller 810, the processor 804, and/or the memory 806, may be performed in any order and at any frequency. Furthermore, although elements may be described or claimed in the singular, the plural is contemplated unless limitation to the singular is explicitly stated. Accordingly, the disclosure is not limited to the illustrated examples and any means for performing the functionality described herein are included in aspects of the disclosure.

The invention claimed is:

1. A device, comprising:
a light projector configured to:
project first light onto a scene in a first distribution including a flood projection when the device operates in a first mode; and
project second light onto the scene in a second distribution including a pattern projection when the device operates in a second mode;
a receiver configured to detect reflections of light projected by the light projector;
a memory storing instructions; and
a processor, connected to the memory, configured to:
determine first depth information based on an amount of time for the first projected light to be reflected back to the receiver when the device operates in the first mode;
determine second depth information based on distortion of at least one pattern of the second projected light by one or more objects in a scene as detected by the receiver when the device operates in the second mode; and
compensate for multipath interference (MPI) errors in the first depth information at least in part by using the second depth information as a reference for removing the MPI errors from the first depth information.

2. The device of claim 1, wherein the processor is further configured to:
determine the first depth information using time-of-flight (ToF) techniques; and
determine the second depth information using structured light (SL) techniques.

3. The device of claim 1, wherein the light projector comprises a switchable diffuser and is further configured to:
activate the switchable diffuser to project the flood projection.

4. The device of claim 3, wherein the pattern projection is created by a diffractive optical element (DOE) disposed between the switchable diffuser and a light source of the light projector.

5. The device of claim 4, wherein the light projector comprises a birefringent material disposed between the DOE and the switchable diffuser, and wherein deactivating the switchable diffuser comprises:
applying a voltage across a refractive material.

6. The device of claim 5, wherein the switchable diffuser has a first refractive index and the birefringent material is a liquid crystal material having a second refractive index, wherein the first refractive index and the second refractive index are different when the light projector does not apply the voltage across the refractive material, and wherein the first refractive index and the second refractive index are the same when the light projector does apply the voltage across the refractive material.

7. The device of claim 6, wherein the light projector does not apply the voltage across the refractive material when the device operates in the first mode, and wherein the light projector does apply the voltage across the refractive material when the device operates in the second mode.

8. The device of claim 3, wherein the light projector is further configured to:
deactivate the switchable diffuser to project the pattern projection.

9. The device of claim 1, wherein the receiver is further configured to:
detect reflections of the first distribution when the device operates in the first mode; and
detect reflections of the second distribution when the device operates in the second mode.

10. The device of claim 1, wherein to the processor is further configured to:
generate a depth map using the second depth information and the first depth information with at least mitigated MPI.

11. The device of claim 1, wherein the receiver comprises a monolithic pixel sensor including at least one global shutter (GS) pixel cell and at least one lock-in pixel cell, and wherein the processor is further configured to:
determine at least one phase difference between the first projected light and reflections detected by the monolithic pixel sensor when the device operates in the first mode.

12. The device of claim 11, wherein the receiver is further configured to:
detect, via the at least one GS pixel cell, near infrared (NIR) light based on the reflections detected by the receiver when the device operates in the second mode.

13. The device of claim 11, wherein the lock-in pixel cell includes two time-of-flight (ToF) gates for operating in a two-phase mode.

14. The device of claim 11, wherein the at least one GS pixel cell is electrically isolated from the at least one lock-in pixel cell, and wherein the lock-in pixel cell includes four time-of-flight (ToF) gates for operating in a four-phase mode.

15. The device of claim 1, wherein the receiver comprises at least one of a complementary metal-oxide semiconductor (CMOS) device and a charge-coupled device (CCD), and wherein the receiver is further configured to:
alternate between detecting reflections of the first distribution and detecting reflections of the second distribution using time-division multiplexed read (TDMR).

16. The device of claim 1, wherein the device is a wireless communication device.

17. A method for depth sensing using a device, comprising:
projecting first light onto a scene in a first distribution including a flood projection when the device operates in a first mode;
projecting second light onto the scene in a second distribution including a pattern projection when the device operates in a second mode;
detecting, by a receiver, reflections of the first projected light and the second projected light;
determining first depth information based on an amount of time for the first projected light to be reflected back to by the receiver when the device operates in the first mode;
determining second depth information based on distortion of at least one pattern of the second projected light by one or more objects in a scene as detected by the receiver when the device operates in the second mode; and
compensating for multipath interference (MPI) errors in the first depth information at least in part by using the second depth information as a reference for removing the MPI errors from the first depth information.

18. The method of claim 17, further comprising:
determining the first depth information using time-of-flight (ToF) techniques; and
determining the second depth information using structured light (SL) techniques.

19. The method of claim 17, wherein the device includes a switchable diffuser, and the method further comprises:
activating the switchable diffuser to project the flood projection.

20. The method of claim 19, further comprising:
deactivating the switchable diffuser to project the pattern projection.

21. The method of claim 17, further comprising:
detecting reflections of the first distribution when the device operates in the first mode; and
detecting reflections of the second distribution when the device operates in the second mode.

22. The method of claim 21, further comprising:
determining at least one phase difference between the projected first light and reflections detected by the receiver when the device operates in the first mode.

23. The method of claim 17, further comprising:
generating a depth map using the second depth information and the first depth information with at least mitigated MPI.

24. The method of claim 17, further comprising:
alternating between detecting reflections of the first distribution and detecting reflections of the second distribution using time-division multiplexed read (TDMR).

25. The method of claim 17, wherein the device is a wireless communication device.

26. A non-transitory computer-readable medium storing instructions that, when executed by one or more processors of an apparatus, causes the apparatus to perform operations comprising:
projecting first light onto a scene in a first distribution including a flood projection when the apparatus operates in a first mode;
projecting second light onto the scene in a second distribution including a pattern projection when the apparatus operates in a second mode;
detecting reflections of the first projected light and the second projected light;
determining first depth information based on an amount of time for the first projected light to be reflected back to the receiver when the apparatus operates in the first mode;
determining second depth information based on distortion of at least one pattern of the second projected light by one or more objects in a scene as detected by the receiver when the apparatus operates in the second mode; and
compensate for multipath interference (MPI) errors in the first depth information at least in part by using the second depth information as a reference for removing the MPI errors from the first depth information.

* * * * *